US005760417A

United States Patent [19]

Watanabe et al.

[11] Patent Number: 5,760,417

[45] Date of Patent: Jun. 2, 1998

[54] SEMICONDUCTOR ELECTRON EMISSION DEVICE

[75] Inventors: Nobuo Watanabe, Gotenba; Norio Kaneko, Atsugi; Masahiko Okunuki, Tokyo; Takeo Tsukamoto, Atsugi, all of Japan

[73] Assignee: Canon Kabushiki Kaisha, Tokyo, Japan

[21] Appl. No.: 410,396

[22] Filed: Mar. 27, 1995

Related U.S. Application Data

[63] Continuation of Ser. No. 251,665, May 31, 1994, abandoned, which is a continuation of Ser. No. 943,035, Sep. 10, 1992, abandoned.

[30] Foreign Application Priority Data

| | | | |
|---|---|---|---|
| Sep. 13, 1991 | [JP] | Japan | 3-234455 |
| Sep. 13, 1991 | [JP] | Japan | 3-234692 |

[51] Int. Cl.[6] .......... H01L 29/47; H01L 29/812; H01L 31/108; H01L 33/00

[52] U.S. Cl. .......... 257/11; 257/101; 257/472; 257/476; 257/481; 257/484; 257/492; 257/493; 257/605; 313/302; 313/305; 313/309; 313/346 R; 313/368

[58] Field of Search .......... 257/10, 11, 15, 257/471, 472, 476, 483, 484, 481, 106, 492, 493, 101, 605; 313/302, 303, 305, 306, 309, 346 R, 368, 366

[56] References Cited

U.S. PATENT DOCUMENTS

| | | | |
|---|---|---|---|
| 4,259,678 | 3/1981 | Van Gorkom et al. | 357/13 |
| 4,303,930 | 12/1981 | Van Gorkom et al. | 357/13 |
| 4,994,708 | 2/1991 | Shimizu et al. | 313/302 |
| 5,107,311 | 4/1992 | Tsukamoto et al. | 257/472 |
| 5,138,402 | 8/1992 | Tsukamoto et al. | 357/15 |
| 5,202,571 | 4/1993 | Hirabayashi et al. | 313/346 R |
| 5,285,079 | 2/1994 | Tsukamoto et al. | 313/366 |
| 5,414,272 | 5/1995 | Watanabe et al. | 257/10 |

FOREIGN PATENT DOCUMENTS

| | | | |
|---|---|---|---|
| 0331373 | 9/1989 | European Pat. Off. | 257/10 |
| 0416558 | 3/1991 | European Pat. Off. . | |
| 1220328 | 9/1989 | Japan . | |

OTHER PUBLICATIONS

G.G.P. van Gorkom et al., "Silicon cold cathodes," *Philips Technical Review*, vol. 43, No. 3, Jan. 1987, pp. 49–57.

*Primary Examiner*—Carl W. Whitehead
*Assistant Examiner*—Alice W. Tang
*Attorney, Agent, or Firm*—Fitzpatrick, Cella, Harper & Scinto

[57] ABSTRACT

In a semiconductor electron emission device for causing an avalanche breakdown by applying a reverse bias voltage to a Schottky barrier junction between a metallic material or metallic compound material and a p-type semiconductor, and externally emitting electrons from a solid-state surface, a p-type semiconductor region (first region) for causing the avalanche breakdown contacts a p-type semiconductor region (second region) for supplying carriers to the first region, and a semi-insulating region is formed around the first region.

43 Claims, 8 Drawing Sheets

SEMICONDUCTOR ELECTRON EMISSION DEVICE

This application is a continuation of application Ser. No. 08/251,665 filed May 31, 1994, now abandoned, which is a continuation of application Ser. No. 07/943,035 filed Sep. 10, 1992, now abandoned.

BACKGROUND OF THE INVENTION

1. Field of the Invention

The present invention relates to a semiconductor electron emission device and, more particularly, to a semiconductor device for causing an avalanche breakdown so as to emit thermoelectrons.

2. Related Background Art

Of conventional semiconductor electron emission devices, the devices described in, e.g., U.S. Pat. Nos. 4,259,678 and 4,303,930 are known as ones using an avalanche breakdown mechanism. In these semiconductor electron emission devices, p- and n-type semiconductor layers are formed on a semiconductor substrate, and a cesium film or the like is deposited on the surface of the n-type semiconductor layer to decrease the work function of the surface, thereby forming an electron emission portion. A reverse bias voltage is applied across the two ends of a pn junction formed by the p- and n-type semiconductor layers to cause an avalanche breakdown so as to generate thermoelectrons, and the thermoelectrons are emitted from the electron emission portion in a direction perpendicular to the surface of the semiconductor substrate.

As disclosed in Japanese Laid-Open Patent Application No. 01-220328 (U.S. Pat. No. 5,138,402), a Schottky barrier junction is formed by a p-type semiconductor and a metal material or a p-type semiconductor and a metallic compound, and a reverse bias voltage is applied across the two ends of the Schottky barrier junction to cause an avalanche breakdown so as to generate thermoelectrons, thereby emitting the electrons from an electron emission portion in a direction perpendicular to the surface of a semiconductor substrate.

The above-mentioned semiconductor electron emission device causes an avalanche breakdown in a high-concentration p-type semiconductor region where a depletion layer having the smallest width is formed upon application of the reverse bias voltage across the two ends of the pn junction or the Schottky barrier junction, and externally emits electrons having high energy generated there from the solid-state surface. However, the depletion layer around the pn junction or the Schottky barrier junction has a radius of curvature determined by the carrier concentration of the semiconductor and the application voltage. Therefore, at an application voltage lower than that causing an avalanche breakdown in the required high-concentration p-type semiconductor region, a breakdown or current leakage occurs around the depletion layer, thus impairing device characteristics.

In the electron emission device using the pn junction or the Schottky barrier junction, the carrier concentration of the p-type semiconductor around the high-concentration p-type semiconductor region causing an avalanche breakdown may be decreased to increase the radius of curvature of a portion around the depletion layer so as to prevent a breakdown at a low voltage there. In this case, however, since the electrical resistance between an electrode for supplying carriers and the high-concentration p-type semiconductor region causing the avalanche breakdown is increased, not only the operation voltage of the device is increased, but also the device characteristics are impaired by, e.g., generation of Joule's heat.

For this reason, since it is inconvenient for the conventional device to extremely decrease the carrier concentration of the p-type semiconductor region around the high-concentration p-type semiconductor region, a guard ring structure of a high-concentration n-type semiconductor is formed to be concentrical with the high-concentration p-type semiconductor region. Thus, the depletion layer is formed contiguously outwardly from the high-concentration p-type semiconductor region to extend over the p-type semiconductor region and the high-concentration n-type semiconductor region so as to increase the outermost radius of curvature, thereby preventing a breakdown or current leakage around the depletion layer.

In the device structure of the above-mentioned conventional semiconductor electron emission device, however, an ion implantation or thermal diffusion process for forming a high-concentration ring-like n-type semiconductor region (guard ring structure), and a process for forming an ohmic contact electrode for applying a voltage to the high-concentration n-type semiconductor guard ring are required, resulting in a complicated manufacturing process.

In order to form the guard ring and the ohmic contact electrode therefor, a wide area is required, thus disturbing miniaturization of the device.

SUMMARY OF THE INVENTION

It is an object of the present invention to provide a compact semiconductor electron emission device, which can simplify the device structure and the manufacturing process, and allows a high-speed device operation.

According to the present invention, there is provided a semiconductor electron emission device which has an electron emission portion formed by a Schottky barrier junction between a metal material or a metallic compound and a p-type semiconductor, and emits electrons from a solid-state surface, wherein the electron emission portion comprises a first p-type semiconductor region for forming the Schottky barrier junction, and causing an avalanche breakdown, a second p-type semiconductor region for supplying carriers to the first p-type semiconductor region, and a semi-insulating region formed around the first p-type semiconductor region.

According to the present invention, there is also provided a semiconductor electron emission device which has an electron emission portion formed by a pn junction between n- and p-type semiconductors, and emits electrons from a solid-state surface, wherein the electron emission portion comprises a first p-type semiconductor region for forming the pn junction, and causing an avalanche breakdown, a second p-type semiconductor region for supplying carriers to the first p-type semiconductor region, and a semi-insulating region formed around the first p-type semiconductor region.

The semiconductor electron emission device having the electron emission portion using the Schottky barrier junction of the metal material or metallic compound and the p-type semiconductor, or the semiconductor electron emission device having the electron emission portion using the pn junction of the n- and p-type semiconductors has a structure comprising the first p-type semiconductor region for forming the Schottky barrier junction or the pn junction, and causing the avalanche breakdown, the second p-type semiconductor region for supplying carriers to the first p-type semiconductor region, and the semi-insulating region located around the first p-type semiconductor region. With this structure, when an operation voltage is applied, since a portion around a depletion region formed in the first p-type semiconductor region is contiguously connected to and protected by the semi-insulating region located around the first p-type semiconductor region and having no carriers (i.e., depleted), an avalanche breakdown or current leakage does not occur around the first p-type semiconductor region. Since the second p-type semiconductor region having an arbitrary carrier concentration is formed as a carrier supply path to the first p-type semiconductor region, the series resistance of the device can be selected to be an arbitrary value.

In a semiconductor electron emission device using a Schottky barrier junction of a metal material or a metallic compound and a high-concentration p-type semiconductor, or a semiconductor electron emission device using a pn junction of high-concentration n- and p-type semiconductors, a high-concentration p-type semiconductor region (first region) causing an avalanche breakdown contacts a p-type semiconductor region (second region) for supplying carriers to the first region, and a p-type semiconductor region (third region) for forming the Schottky barrier junction or the pn junction is formed around the first region. In this structure, the first to third regions are formed to have the following relationship among their carrier concentrations:

(first region)>(second region)>(third region)

Thus, upon application of an operation voltage, a portion having a low breakdown voltage (i.e., having a small radius of curvature) around a depletion layer formed in the first region is protected by a depletion layer having a high breakdown voltage (i.e., having a large radius of curvature) formed in the third region contiguously located around the first region and having a low carrier concentration. In this case, when the first region is completely surrounded by the third region, the carrier supply path to the first region has too high a resistance, and the device characteristics are impaired, as described above. Thus, since the second region having the above-mentioned carrier concentration is formed in the carrier supply path to the first region, the series resistance of the device can be selected to be a proper value. Therefore, an element structure requiring no high-concentration n-type semiconductor guard ring structure, which is inconvenient to achieve a simple manufacturing process and a compact device, can be realized.

When the relationship among the carrier concentrations of the first to third regions may be set to satisfy:

(second region)>(first region)>(third region)

the high-concentration n-type semiconductor guard ring structure is not required, as described above. When the carrier concentration of the second region is set to be equal to or higher than that of the first region, the series resistance of the device can be greatly decreased. Therefore, a product RC of a resistance R and an electrical capacitance C can be decreased, and a semiconductor electron emission device having a high operation speed can be manufactured.

According to the present invention, there is also provided a semiconductor electron emission device which has an electron emission portion formed by a Schottky barrier junction between a metal material or a metallic compound and a semiconductor, and emits electrons from a solid-state surface, wherein the electron emission portion comprises a first p-type semiconductor region for forming the Schottky barrier junction and causing an avalanche breakdown, a second p-type semiconductor region, contacting the first p-type semiconductor region, for supplying carriers to the first p-type semiconductor region, and an n-type semiconductor region located around the first p-type semiconductor region to form a pn junction with the first p-type semiconductor region, and to form a Schottky barrier junction with the metal material or metallic compound, and carrier concentrations of the first and second p-type semiconductor regions and the n-type semiconductor region satisfy the relationship:

(first p-type semiconductor region) > (second p-type semiconductor region) > (n-type semiconductor region)
or
(second p-type semiconductor region) ≧ (first p-type semiconductor region) > (n-type semiconductor region)

According to the present invention, there is also provided a semiconductor electron emission device which has an electron emission portion formed by a pn junction between n- and p-type semiconductors, and emits electrons from a solid-state surface, wherein the electron emission portion comprises a first n-type semiconductor region located on the solid-state surface, a first p-type semiconductor region for forming the pn junction with the first n-type semiconductor region and causing an avalanche breakdown, a second p-type semiconductor region, contacting the first p-type semiconductor region, for supplying carriers to the first p-type semiconductor region, and a second n-type semiconductor region, located around the first p-type semiconductor region, for forming the pn junction with the first p-type semiconductor region, and carrier concentrations of the first and second p-type semiconductor regions and the first and second n-type semiconductor regions satisfy the relationship:

(first n-type semiconductor region) > (first p-type semiconductor region) > (second p-type semiconductor region) > (second n-type semiconductor region)

Furthermore, in a semiconductor electron emission device, an n-type semiconductor region having a low carrier concentration is formed around a high-concentration first p-type semiconductor region for causing an avalanche breakdown. Thus, upon application of an operation voltage, since a portion around a depletion layer formed in the first p-type semiconductor region is contiguously connected to and protected by a depletion layer formed therearound by a pn junction, neither breakdown nor current leakage occur around the first p-type semiconductor region. Therefore, a device structure requiring no high-concentration n-type semiconductor guard ring structure, which is inconvenient to achieve a simple manufacturing process and a compact device, can be realized.

When a second p-type semiconductor region is formed as a carrier supply path to the first p-type semiconductor region, the series resistance of the device can be selected to be a proper value. Therefore, the device operation speed can be increased.

BRIEF DESCRIPTION OF THE DRAWINGS

FIGS. 6A and 6B show a pn junction type semiconductor electron emission device according to the second embodiment of the present invention, in which FIG. 6A is a sectional view of the device, and FIG. 6B is a sectional view showing a depletion region;

FIGS. 7A and 7B show a multi semiconductor electron emission device according to the third embodiment of the present invention, in which FIG. 7A is a plan view of the device, and FIG. 7B is a sectional view taken along a line XIIb—XIIb of FIG. 7A;

FIGS. 10A and 10B show a Schottky barrier junction type multi semiconductor electron emission device according to the sixth embodiment of the present invention, in which FIG. 10A is a plan view of the device, and FIG. 10B is a sectional view taken along a line Xb—Xb of FIG. 10A;

FIGS. 13A and 13B show a Schottky barrier junction type semiconductor electron emission device according to the ninth embodiment of the present invention, in which FIG. 13A is a plan view of the device, and FIG. 13B is a sectional view taken along a line XIIIb—XIIIb of FIG. 13A.

DESCRIPTION OF THE PREFERRED EMBODIMENTS

The preferred embodiments of the present invention will be described hereinafter with reference to the accompanying drawings.

[First Embodiment]

The first embodiment of the present invention will be described below with reference to FIG. 1.

Figure 1:
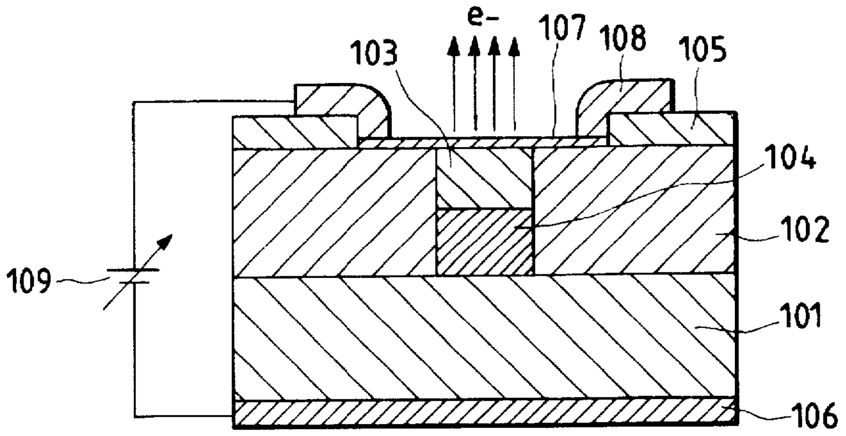
FIG. 1 is a sectional view showing a Schottky barrier junction type semiconductor electron emission device according to the first embodiment of the present invention.

FIG. 1 is a sectional view showing a Schottky barrier junction type semiconductor electron emission device according to the first embodiment of the present invention.

The semiconductor electron emission device of this embodiment is a Schottky barrier junction type device having the following structure. That is, a cylindrical high-concentration p-type semiconductor region 103 as a first p-type semiconductor region, and a cylindrical p-type semiconductor region 104 as a second p-type semiconductor region for supplying carriers to the high-concentration p-type semiconductor region 103 are arranged at substantially the central portion on a high-concentration p-type semiconductor substrate 101 to be in contact with each other. A semi-insulating region 102 is formed outwardly concentrically around the high-concentration p-type semiconductor region 103 and the p-type semiconductor region 104. A metallic film 107 for forming a Schottky barrier junction with the high-concentration p-type semiconductor region 103 is formed on the device surface.

Furthermore, the semiconductor electron emission device of this embodiment comprises an ohmic contact electrode 106 for the high-concentration p-type semiconductor substrate 101 and an electrode wiring layer 108 for the metallic film 107 so as to apply a reverse bias voltage to the Schottky barrier junction. The reverse bias voltage is applied from a power supply 109 through the ohmic contact electrode 106 and the metallic film 107.

Note that the electrode wiring layer 108 contacts the metallic film 107 through an insulating film 105 formed along the surface edge portion of the semi-insulating region 102 so as to prevent short-circuiting with the above-mentioned p-type semiconductor region or the semi-insulating region.

Figure 2:
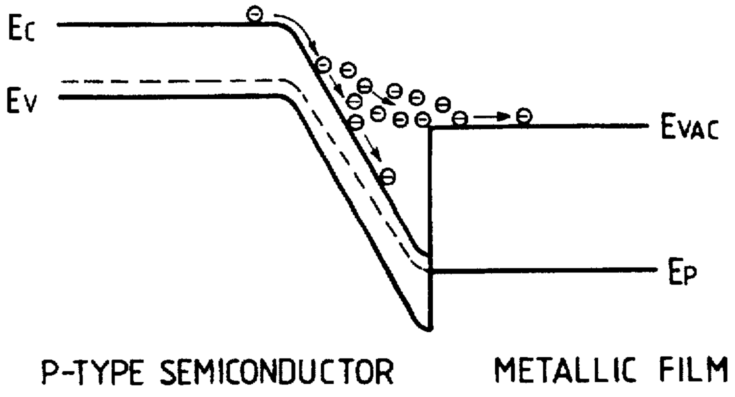
FIG. 2 is a graph showing an example of an energy band of the Schottky barrier junction type semiconductor electron emission device.

An electron emission process in the Schottky barrier junction type semiconductor electron emission device will be described below with reference to FIG. 2.

Figure 3:
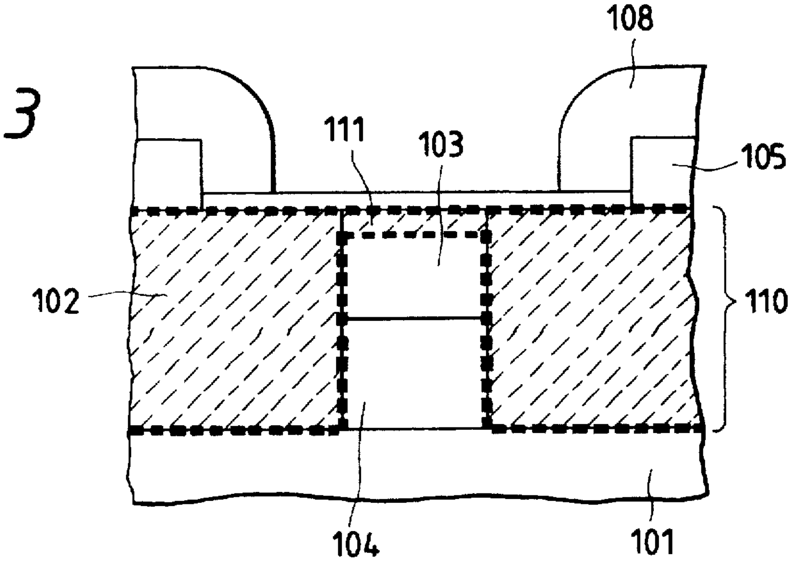
FIG. 3 is a sectional view showing an example of a depletion region formed in the Schottky barrier junction type semiconductor electron emission device.

When a reverse bias voltage is applied to a Schottky diode forming a Schottky barrier junction with a p-type semiconductor, a bottom $E_c$ of the conduction band of the p-type semiconductor has a higher energy level than a vacuum level $E_{VAC}$ of a metallic electrode forming the Schottky barrier, and an avalanche breakdown is generated. Electrons generated by the avalanche breakdown obtain energy higher than the lattice temperature by an electric field in a depletion layer formed at a semiconductor-metallic electrode interface, and are injected from the p-type semiconductor to the metallic electrode forming the Schottky barrier. Some electrons having energy larger than the work function of the metallic electrode surface forming the Schottky barrier junction are emitted into vacuum. Therefore, like in the conventional device, to perform a low-work function treatment of the surface of an electron emission portion leads to an increase in electron emission amount. FIG. 3 shows the shapes of a region 111 where an avalanche breakdown occurs and a depletion region 110 in the Schottky barrier junction type semiconductor electron emission device of this embodiment.

The details of the manufacturing process of the semiconductor electron emission device shown in FIG. 1 will be described below.

(1) A 0.6-μm thick low-concentration p-type GaAs semiconductor layer having a beryllium (Be) concentration of $1\times10^{15}$ $cm^{-3}$ or less was grown on a zinc (Zn)-doped high-concentration p-type semiconductor substrate 101 (GaAs) having a carrier concentration of $5\times10^{18}$ $cm^{-3}$ by the molecular beam epitaxy (MBE) method. The low-concentration p-type GaAs semiconductor layer forms the semi-insulating region 102 later.

(2) Be ions accelerated to 40 keV were implanted in a region, corresponding to the p-type semiconductor region 103, of the low-concentration p-type GaAs semiconductor layer from the surface of the low-concentration p-type GaAs semiconductor layer to a depth of about 0.2 μm by the focused ion beam (FIB) implantation method so as to have an impurity concentration of $2\times10^{18}$ $cm^{-3}$.

(3) Be ions accelerated to 160 keV were also implanted in a region, corresponding to the p-type semiconductor region 104, of the low-concentration p-type GaAs semiconductor layer by the FIB implantation method until they reach the high-concentration p-type semiconductor substrate 101 so as to have an impurity concentration of $1\times10^{18}$ $cm^{-3}$.

(4) An $SiO_2$ film having a thickness of about 0.1 μm and serving as a capping material for annealing was deposited by the sputtering method on the surface of the low-concentration p-type GaAs semiconductor layer implanted with the Be ions, as described above. Thereafter, the implanted portions were activated by annealing at a temperature of 850° C. for 10 seconds.

(5) After the $SiO_2$ film for the above-mentioned annealing was removed, an inverted pattern of a region corresponding to the semi-insulating region 102 was formed on the low-concentration p-type GaAs semiconductor layer by a normal photolithography technique, and boron (B) ions accelerated to 200 keV, 80 keV, and 20 keV were implanted to have a uniform concentration (about $2\times10^{19}$ $cm^{-3}$) from at least the surface of the low-concentration p-type GaAs semiconductor layer to the surface of the high-concentration p-type semiconductor substrate 101, thereby forming the semi-insulating region 102.

(6) A 0.5-μm thick $SiO_2$ film was formed as the insulating film 105. A gold (Au)/chromium (Cr) film was vacuum-deposited on the lower surface of the high-concentration p-type semiconductor substrate 101, and was annealed at a temperature of 350° C. for 5 minutes, thereby forming the ohmic contact electrode 106.

(7) An opening for forming the Schottky barrier junction was formed in the insulating film 105 by the normal photolithography technique. Thereafter, tungsten (W) was selected as a material for forming the Schottky barrier junction with the high-concentration p-type semiconductor region 103 consisting of the p-type GaAs semiconductor, and an 8-nm thick metallic film 107 was formed in the opening by electron beam deposition and normal photolithography. Upon formation of the metallic film 107, an electron emission portion using the Schottky barrier junction with the high-concentration p-type semiconductor region 103 is formed.

(8) Aluminum was vacuum-deposited on the junction portion between the insulating film 105 and the metallic film 107, and the electrode wiring layer 108 was formed by the normal photolithography technique.

Figure 4:
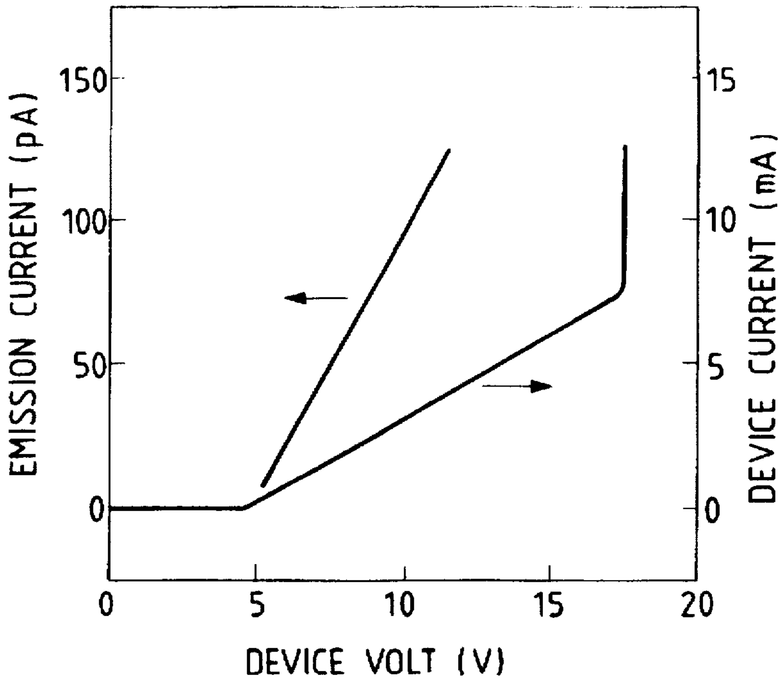
FIG. 4 is a graph showing an example of the current-voltage characteristics of the semiconductor electron emission device of the present invention.

The semiconductor electron emission device manufactured in this manner was placed in a vacuum chamber maintained at a vacuum of about $1\times10^{-7}$ Torr, and a voltage of 7 V was applied from the power supply 109 across the ohmic contact electrode 106 and the electrode wiring layer 108. As a result, electron emission of about 15 pA was observed from the surface of the metallic film 107 on the high-concentration p-type semiconductor region 103. When the application voltage (device voltage) was sequentially increased up to 10 V, as shown in FIG. 4, the electron emission amount (emission current) was also sequentially increased up to about 100 pA. It is considered that the depletion region 110 (see FIG. 3) upon application of the device voltage is widened by about 0.04 μm from the Schottky barrier interface with the metallic film 107 in the high-concentration p-type semiconductor region 103. Since a portion around the depletion region 110 is protected by the depleted semi-insulating region 102, the electric field is most concentrated on the avalanche region 111 (FIG. 3) of the high-concentration p-type semiconductor region 103, and an avalanche breakdown can efficiently occur in this region.

Figure 5:
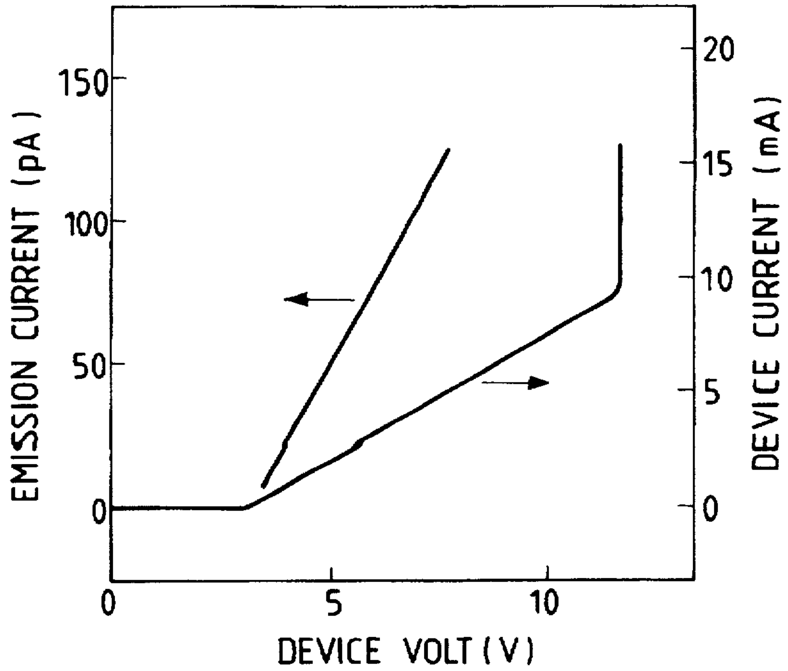
FIG. 5 is a graph showing another example of the current-voltage characteristics of the semiconductor electron emission device of the present invention.

FIG. 5 shows the electrical characteristics obtained when the semiconductor electron emission device was manufactured while changing only the impurity concentration of the p-type semiconductor region 104 as the second p-type semiconductor region for supplying carriers to the high-concentration p-type semiconductor region 103 as the first p-type semiconductor region to $3\times10^{18}$ $cm^{-3}$ in the above-mentioned manufacturing conditions, and was placed in the same vacuum chamber as described above. When a device voltage of 5 V was applied from the power supply 109 to this semiconductor electron emission device, electron emission (emission current) of about 50 pA was observed from the surface of the metallic film 107 on the high-concentration p-type semiconductor region 103. When the device voltage was sequentially increased up to 7 V, the emission current was also sequentially increased up to about 100 pA.

In this embodiment, another electrode may be formed on the electrode wiring layer 108 through an insulating film so as to set a potential difference between this electrode and the electrode wiring layer 108. With this structure, the flying direction and potential energy of the electrons emitted from the electron emission portion can be regulated.

In this manner, when the carrier concentration of the p-type semiconductor region 104 is changed, the current-voltage characteristics of the semiconductor electron emission device can be regulated. Thus, the resistance of the p-type semiconductor region 104 is decreased, thereby decreasing the series resistance of the device, and increasing the operation speed.

In the above-mentioned embodiment, GaAs is used as a semiconductor. As other semiconductor materials, for example, Si, Ge, GaP, AlAs, GaAsP, AlGaAs, SiC, BP, AlN, diamond, and the like are applicable in principle, and in particular, an indirect transition type material having a wide bandgap is suitable. The semi-insulating region 102 can be formed by utilizing various intrinsic crystal defects, a residual impurity, and an intentionally added compensation impurity. When the semi-insulating region 102 is formed, an undoped crystal including no dopant is applicable since it has semi-insulating characteristics.

In this embodiment, the semi-insulating region 102 is formed by implanting B ions. When GaAs is used as a semiconductor, various other ion sources such as chromium (Cr), oxygen (O), hydrogen (H), or the like may be used in place of B ions to obtain the same result as described above.

As the material of the ohmic contact electrode 106, in place of tungsten (W), generally known materials such as Al, Au, $LaB_6$, and the like may be used as long as they can form a Schottky barrier junction with the p-type semiconductor. In this case, as described above, as the work function of this electrode surface is smaller, the electron emission efficiency is increased. For this reason, when the work function of the selected electrode material is large, a thin film of a material having a low work function such as Cs may be coated on the surface, thereby improving the electron emission efficiency.

[Second Embodiment]

The second embodiment of the present invention will be described below with reference to FIGS. 6A and 6B.

Figure 6A:
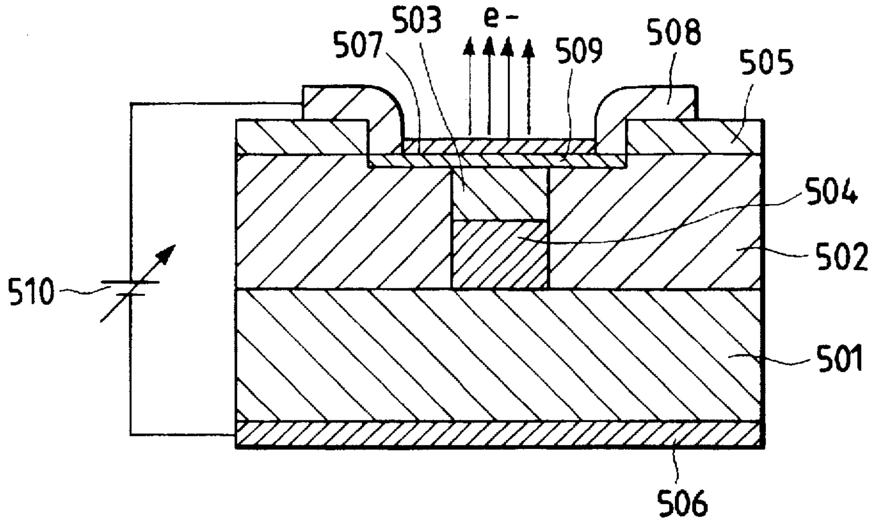
Figure 6B:
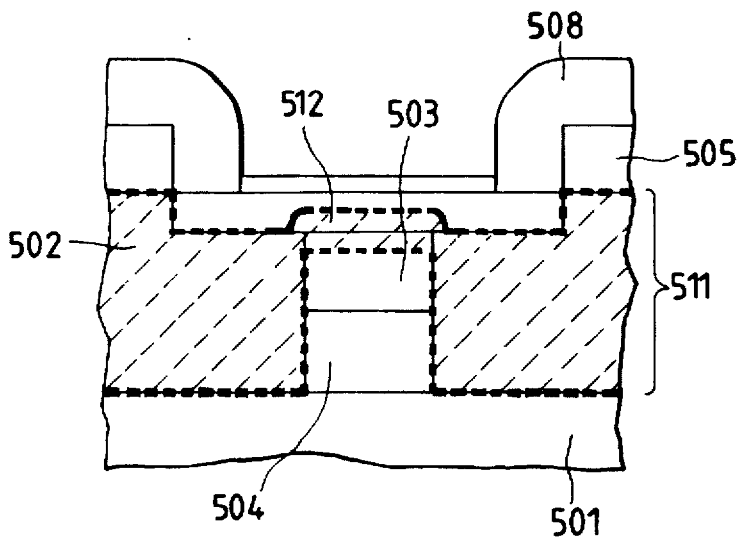

FIGS. 6A and 6B show a pn junction type semiconductor electron emission device according to the second embodiment of the present invention. FIG. 6A is a sectional view of the device, and FIG. 6B is a sectional view showing the shape of a depletion layer.

The semiconductor electron emission device of this embodiment is of a pn junction type device having the following structure. That is, a cylindrical high-concentration p-type semiconductor region 503 as a first p-t-ype semiconductor region and a p-type semiconductor region 504 as a second p-type semiconductor region for supplying carriers to the high-concentration p-type semiconductor region 503 are formed on substantially the central portion on a high-concentration p-type semiconductor substrate 501 to be in contact with each other. A semi-insulating region 502 is formed outwardly concentrically around the high-concentration p-type semiconductor region 503 and the p-type semiconductor region 504. In addition, a high-concentration n-type semiconductor region 509 forming a pn junction with the high-concentration p-type semiconductor region 503 is formed on the device surface.

Furthermore, the semiconductor electron emission device of this embodiment comprises an ohmic contact electrode 506 for the high-concentration p-type semiconductor substrate 501, an ohmic contact electrode 508 for the high-concentration n-type semiconductor region 509, and a low-work function coating film 507 formed on the surface of the high-concentration n-type semiconductor region 509 so as to apply a reverse bias voltage to the pn junction portion. The reverse bias voltage is applied from a power supply 510 through the ohmic contact electrodes 506 and 508.

Note that the ohmic contact electrode 508 contacts the high-concentration n-type semiconductor region 509 via an insulating film 505 formed along the surface edge portion of the semi-insulating region 502 so as to prevent short-circuiting with the semi-insulating region 502. In FIG. 6B, the shape at the edge of a depletion region upon application of the reverse bias voltage is designated by 511, and a region where an avalanche breakdown occurs upon application of the reverse bias voltage is designated by 512.

The details of the manufacturing process of the pn junction type semiconductor electron emission device of this embodiment will be described below.

(1) A 0.6-μm thick low-concentration n-type GaAs semiconductor layer having an Si concentration of $1\times10^{15}$ $cm^{-3}$ or less was grown on a Zn-doped high-concentration p-type semiconductor substrate 501 (GaAs) having a carrier concentration of $5\times10^{18}$ $cm^{-3}$ by the MBE method. This low-concentration n-type GaAs semiconductor layer forms the semi-insulating region 502 later.

(2) Be ions accelerated to 40 keV were sequentially implanted by the FIB implantation method in a region, corresponding to the high-concentration p-type semiconductor region 503, of the low-concentration n-type GaAs semiconductor layer from the surface of the low-concentration n-type GaAs semiconductor layer to a depth of 0.2 μm so as to have an impurity concentration of $2\times10^{18}$ $cm^{-3}$.

(3) Be ions accelerated to 160 keV were implanted by the FIB implantation method in a region, corresponding to the p-type semiconductor region 504, of the low-concentration n-type GaAs semiconductor layer until they reach the high-concentration p-type semiconductor substrate 501 so as to have an impurity concentration of $5\times10^{17}$ $cm^{-3}$.

(4) Si ions accelerated to 10 keV were implanted by a normal ion implantation method in a region, corresponding to the high-concentration n-type semiconductor region 509, of the low-concentration n-type GaAs semiconductor layer to a depth of 1.0 nm so as to have an impurity concentration of about $1\times10^{19}$ $cm^{-3}$. Electrons generated by an avalanche breakdown pass through the high-concentration n-type semiconductor region 509. For this reason, if this region 509 is too thick, an energy loss of the electrons is increased by scattering therein, and the electron emission amount is considerably decreased. Thus, it is preferable to perform this ion implantation at a low acceleration voltage, or to etch the surface to have a thickness of 10 nm or less. Upon formation of the high-concentration n-type semiconductor region 509, an electron emission portion consisting of a pn junction with the high-concentration p-type semiconductor region 503 is formed.

(5) An $SiO_2$ film having a thickness of about 0.1 μm and serving as an annealing protection film was deposited by a normal sputtering method on the surface of the low-concentration n-type GaAs semiconductor layer subjected to the above-mentioned ion implantation. Thereafter, the ion-implanted portions were activated by annealing at a temperature of 850° C. for 10 seconds.

(6) After the $SiO_2$ film for the above-mentioned annealing was removed, an ion implantation mask for a region other than the semi-insulating region 502 was formed by a normal photolithography method, and H ions accelerated to 180 keV, 140 keV, and 30 keV were implanted to have a substantially uniform impurity concentration of $1\times10^{19}$ $cm^{-3}$ between the surface of the low-concentration n-type GaAs semiconductor layer and the high-concentration p-type semiconductor substrate 501, thereby forming the semi-insulating region 502.

(7) A 0.5-μm thick $SiO_2$ film was formed to form the insulating film 505, and an opening having a range corresponding to the high-concentration n-type semiconductor region 509 was formed in the $SiO_2$ film by a normal photolithography method, thereby exposing the high-concentration n-type semiconductor region 509. An Au/Cr film as the ohmic contact electrode 506 for the high-concentration p-type semiconductor substrate 501 and an Au/Ge film as the ohmic contact electrode 508 for the high-concentration n-type semiconductor region 509 were vacuum-deposited, and were photolithographically etched. Thereafter, the resultant structure was converted into an alloy by a heat treatment at a temperature of 350° C. for 5 minutes.

(8) Cesium (Cs) as a low-work function material was deposited on the exposed high-concentration n-type semiconductor region 509 as thin as a monoatomic layer in ultra high vacuum, thus forming the low-work function coating film 507.

The semiconductor electron emission device manufactured in this manner was placed in a vacuum chamber maintained at a vacuum of about $1\times10^{-1}$ Torr or less, and a device voltage of 6 V was applied from the power supply 510 across the ohmic contact electrodes 506 and 508. As a result, electron emission of about 0.1 μA was observed from the surface of the low-work function coating film 507 (Cs) on the high-concentration p-type semiconductor region 503. In this manner, according to this embodiment, a pn junction type semiconductor electron emission device, which has electron emission characteristics equivalent to those of the conventional semiconductor electron emission device, and also has a simple manufacturing process, can be formed.

In this embodiment, another electrode may be formed on the ohmic contact electrode 508 through an insulating film so as to set a potential difference between this electrode and the ohmic contact electrode 508 like in the first embodiment. With this structure, the flying direction and kinetic energy of the emitted electrons can be regulated.

[Third Embodiment]

The third embodiment of the present invention will be described below with reference to FIGS. 7A and 7B.

Figure 7A:
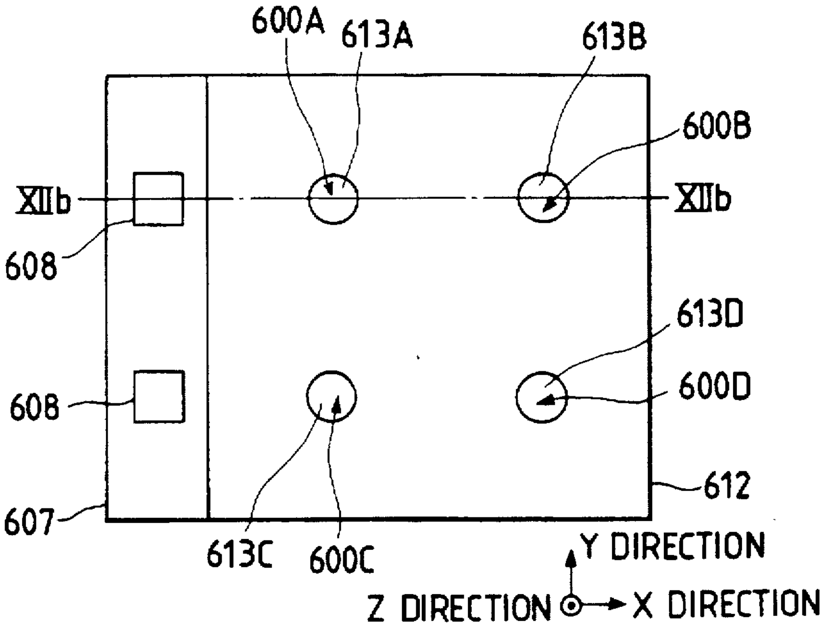
Figure 7B:
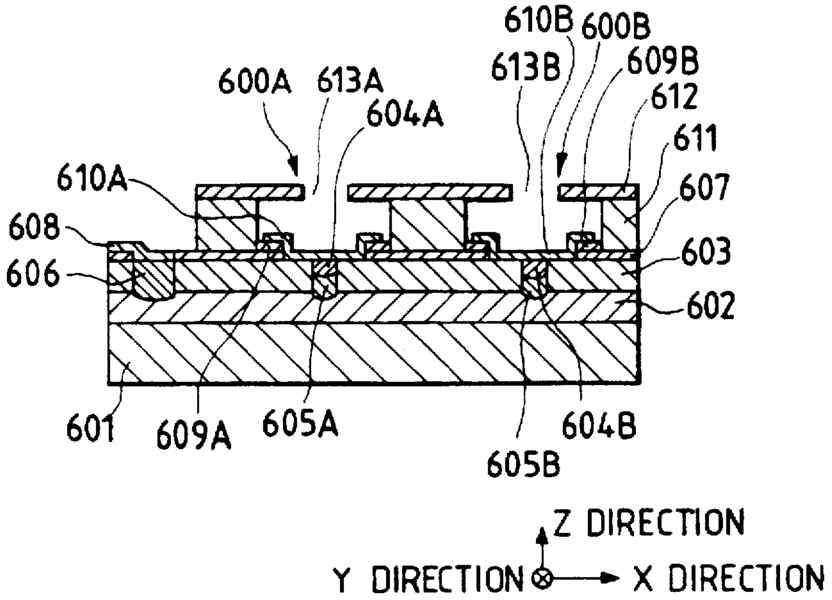

FIGS. 7A and 7B show a multi semiconductor electron emission device provided with a plurality of Schottky barrier junction type electron emission portions according to the third embodiment of the present invention. FIG. 7A is a plan view of the device, and FIG. 7B is a sectional view taken along a line XIIb—XIIb of FIG. 7A.

In the multi semiconductor electron emission device of this embodiment, four electron emission portions 600A, 600B, 600C, and 600D each having the same structure as that in the first embodiment are arranged in a matrix on a high-concentration p-type semiconductor region 602 formed on a semiconductor substrate 601.

Since the electron emission portions 600A, 600B, 600C, and 600D have the same structure, the electron emission portion 600A will be described below.

The electron emission portion 600A comprises a high-concentration p-type semiconductor region 604A as a first p-type semiconductor region, a p-type semiconductor region 605A as a second p-type semiconductor region, contacting the high-concentration p-type semiconductor region 604A, for supplying carriers to the high-concentration p-type semiconductor region 604A, a semi-insulating region 603 formed around the high-concentration p-type semiconductor region 604A and the p-type semiconductor region 605A, and a Schottky electrode 610A for forming a Schottky barrier junction with the high-concentration p-type semiconductor region 604A.

Furthermore, an ohmic contact electrode 608 for the high-concentration p-type semiconductor region 602, and an electrode wiring layer 609A for the Schottky electrode 610A are formed so as to apply a reverse bias voltage to the Schottky barrier junction. The electrode wiring layer 609A contacts the Schottky electrode 610A on an insulating film 607 formed on the semi-insulating region 603 so as to prevent short-circuiting with the above-mentioned p-type semiconductor region or the semi-insulating region.

The ohmic contact electrode 608 contacts the high-concentration p-type semiconductor region 602 via a high-concentration p-type semiconductor region 606. In this embodiment, as shown in FIG. 7A, two electrodes 608 are formed. These ohmic contact electrodes 608 are common to the four electron emission portions 600A, 600B, 600C, and 600D.

The electrode wiring layer 609A may be commonly connected to electrode wiring layers 609B, 609C, and 609D (609C and 609D are not shown) of the remaining electron emission portions 600B, 600C, and 600D. In this case, since the common ohmic contact electrodes 608 are used, the electron emission operations of the four electron emission portions 600A, 600B, 600C, and 600D are simultaneously controlled. On the other hand, when the electrode wiring layers 609A, 609B, 609C, and 609D of the electron emission portions 600A, 600B, 600C, and 600D are independently formed, the electron emission operations can be performed in units of the electron emission portions 600A, 600B, 600C, and 600D. The electrode wiring layers may be formed in a matrix, so that electrons are emitted from an electron emission portion corresponding to an intersection where a current flows. The device surface formed with the four electron emission portions 600A, 600B, 600C, and 600D with the above-mentioned structure is covered with a gate 612 consisting of a metallic film through a support member 611 formed on the insulating film 607, and formed of an insulating material, except for the ohmic contact electrodes 608. Opening portions 613A, 613B, 613C, and 613D are formed in the gate 612 at corresponding positions above the electron emission portions 600A, 600B, 600C, and 600D. Electrons emitted from the electron emission portions 600A, 600B, 600C, and 600D are externally discharged through the opening portions 613A, 613B, 613C, and 613D. The pattern of the gate may be arbitrarily changed to be connected to the electrode wiring layers 609A, 609B, 609C, and 609D so as to regulate the flying direction of electrons, or to set a potential difference between the gate and the electrode wiring layers so as to regulate potential energy.

The details of the manufacturing process of the multi semiconductor electron emission device will be described below.

(1) An inverted pattern was formed on an undoped semi-insulating semiconductor substrate 601 (GaAs) having an impurity concentration of $1\times10^{14}$ $cm^{-3}$ or less by a normal photolithography technique. Thereafter, Be ions were implanted in the semiconductor substrate to have an impurity concentration of $3\times10^{18}$ $cm^{-3}$ by a normal ion implantation method.

The resultant structure was annealed at a temperature of 850° C. for 10 seconds, thereby forming a stripe-like high-concentration p-type semiconductor region 602 elongated in the X-direction.

(2) A 0.6-μm thick low-concentration n-type GaAs semiconductor layer having an Si concentration of $1\times10^{15}$ $cm^{-3}$ or less was grown by the MBE method.

(3) Be ions accelerated to 40 kev were implanted by the FIB implantation method in regions, corresponding to the high-concentration p-type semiconductor regions 604A, 604B, 604C, and 604D, of the low-concentration n-type GaAs semiconductor layer so as to have an impurity concentration of $2\times10^{18}$ $cm^{-3}$. Be ions accelerated to 160 keV were implanted by the FIB implantation method in regions corresponding to the p-type semiconductor regions 605A, 605B, 605C, and 605D so as to have an impurity concentration of $5\times10^{17}$ $cm^{-3}$.

(4) Be ions were implanted by the FIB implantation method in a region, corresponding to the high-concentration p-type semiconductor region 606, of the low-concentration n-type GaAs semiconductor layer from the surface of the low-concentration n-type GaAs semiconductor layer to the high-concentration p-type semiconductor region 602 so as to have an impurity concentration of $3\times10^{18}$ $cm^{-3}$.

The FIB implantation processes and the MBE growth process in the above-mentioned processes (1) to (4) can be performed without being exposed to the outer air since corresponding apparatuses are connected through a vacuum tunnel.

Upon completion of these processes, the high-concentration p-type semiconductor regions 604A, 604B, 604C, 604D, and 606, and the p-type semiconductor regions 605A, 605B, 605C, and 605D were activated by annealing at a temperature of 850° C. for 10 seconds.

(5) An ion implantation mask was formed on a region, other than that corresponding to the semi-insulating region 603, of the low-concentration n-type GaAs semiconductor layer by a normal photolithography method, and thereafter, H ions accelerated to 180 keV, 140 keV, and 30 keV were implanted from the surface of the low-concentration n-type GaAs semiconductor layer to a depth of the surface of the high-concentration p-type semiconductor region 602 so as to have almost a uniform impurity concentration of $1\times10^{19}$ $cm^{-3}$, thereby forming the semi-insulating region 603.

(6) A 0.2-μm thick $SiO_2$ film was deposited by a normal sputtering method on the semi-insulating region 603 formed by the above-mentioned ion implantation. Thereafter, in order to form Schottky barrier junctions of the electron emission portions 600A, 600B, 600C, and 600D, openings were formed by a normal photolithographic etching method to expose portions of the high-concentration p-type semiconductor regions 604A, 604B, 604C, and 604D. In addition, a portion of the high-concentration p-type semiconductor region 606 was similarly exposed so as to form an ohmic contact. An Au/Cr film was vacuum-deposited on the high-concentration p-type semiconductor region 606, and was annealed at a temperature of 350° C. for 5 minutes, thereby forming the ohmic contact electrode 608.

(7) Aluminum (Al) was used as a material for forming electrode wiring layers, and tungsten (W) was used as a material for forming the Schottky barrier junctions. An 0.5-μm thick Al film and an 8-nm thick W film were deposited by the electron beam deposition, and were photolithographically etched to form the electrode wiring layers 609A, 609B, 609C, and 609D, and the Schottky electrodes 610A, 610B, 610C, and 610D.

(8) As the support member 611 formed of an insulating material and the gate 612, an $SiO_2$ film and a tungsten (W) film were sequentially deposited by the vacuum deposition method, and were photolithographically etched to form the opening portions 613A, 613B, 613C, and 613D.

With the above-mentioned processes (1) to (8), the multi semiconductor electron emission device having the four electron emission portions 600A, 600B, 600C, and 600D was completed.

Following the same procedures as above, a multi semiconductor electron emission device on which 20 (X-direction)×10 (Y-direction) electron emission portions were aligned in a matrix was manufactured, was placed in a vacuum chamber maintained at a vacuum of about $1\times10^{-7}$ Torr, and a reverse bias voltage of 7 V was applied to all the electron emission portions. As a result, electron emission of a total of about 20 nA was observed. It was confirmed that when a reverse bias voltage was applied across an arbitrary ohmic contact electrode 608 and an arbitrary electrode wiring layer 609, a device at the intersection emitted electrons. In this manner, according to this embodiment, an electron emission device, which has electron emission characteristics equivalent to those of the conventional multi semiconductor electron emission device, and can be easily manufactured, can be formed.

[Fourth Embodiment]

Figure 8:
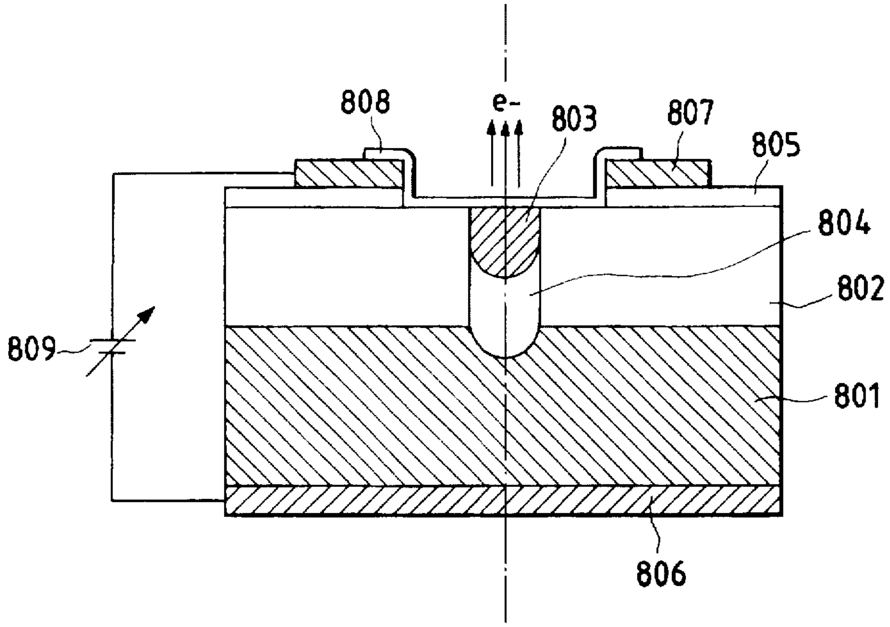
FIG. 8 is a sectional view showing a Schottky barrier junction type semiconductor electron emission device according to the fourth embodiment of the present invention.

FIG. 8 is a schematic sectional view showing a semiconductor electron emission device using a Schottky barrier junction according to the fourth embodiment of the present invention. The device shown in FIG. 8 comprises a high-concentration p-type semiconductor substrate 801, a low-concentration p-type semiconductor layer 802, a high-concentration p-type semiconductor region (first region) 803 for causing an avalanche breakdown, a p-type semiconductor region (second region) 804 for setting the series resistance of the device, an insulating film 805, an ohmic contact electrode 806 for the p-type semiconductor, an electrode wiring layer 807, a thin metallic film (electrode) 808 for forming a Schottky barrier junction with the p-type semiconductor, and a power supply 809.

The manufacturing process of the semiconductor electron emission device shown in FIG. 8 will be described below.

(1) The 0.6-μm thick low-concentration p-type GaAs semiconductor layer 802 having a beryllium (Be) concentration of $1\times10^{15}$ $cm^{-3}$ or less was grown by the molecular beam epitaxy (MBE) method on the zinc (Zn)-doped high-concentration p-type GaAs semiconductor substrate 801 having a carrier concentration of $5\times10^{18}$ $cm^{-3}$.

(2) Be ions accelerated to 40 keV were implanted by the focused ion beam (FIB) implantation method in the high-concentration p-type semiconductor region 803 so as to have a carrier concentration of $2\times10^{18}$ $cm^{-3}$ from the surface of the low-concentration p-type semiconductor layer 802 to a depth of about 0.2 μm.

(3) Be ions accelerated to 160 keV were implanted by the FIB implantation method in the p-type semiconductor region 804 so that they reached the high-concentration p-type GaAs semiconductor substrate 801 to have a carrier concentration of $1\times10^{18}$ $cm^{-3}$.

(4) An $SiO_2$ film having a thickness of about 0.2 μm was deposited by a sputtering method as the insulating film 805, and thereafter, the ion-implanted portions-were activated by annealing at a temperature of 850° C. for 10 seconds.

(5) A gold (Au)/chromium (Cr) film was vacuum-deposited on the lower surface of the high-concentration p-type GaAs semiconductor substrate 801, and was annealed at a temperature of 350° C. for 5 minutes, thereby forming the ohmic contact electrode 806.

(6) An aluminum film was vacuum-deposited, and was photolithographically etched to form the electrode wiring layer 807 and an opening portion of the insulating film 805.

(7) Tungsten (W) was selected as a material for forming a Schottky barrier junction with the p-type GaAs semiconductor, and the 8-nm thick electrode 806 was formed by electron beam deposition and normal photolithography.

The semiconductor electron emission device (FIG. 8) manufactured in this manner was placed in a vacuum chamber maintained at a vacuum of about $1\times10^{-7}$ Torr, and a voltage of 7 V was applied from the power supply 809. As a result, electron emission of about 50 pA from the W surface on the high-concentration p-type semiconductor region 803 was observed. As in FIG. 4, when the application voltage (device voltage) was sequentially increased up to 10 V, the electron emission amount (emission current) was also sequentially increased up to about 100 pA. It is considered that a depletion layer formed upon application of the operation voltage is widened by about 0.04 μm from the Schottky barrier interface in the high-concentration p-type semiconductor region 803. It is also considered that the depletion layer is widened by 0.6 μm or more, i.e., reaches the high-concentration p-type semiconductor substrate 801 in the low-concentration p-type semiconductor region 802 around the high-concentration p-type semiconductor region 803. Therefore, an electric field is most concentrated on a portion of the high-concentration p-type semiconductor region 803, and an avalanche breakdown efficiently occurs in this region.

The electrical characteristics obtained when the device was manufactured while changing only the impurity concentration of the p-type semiconductor region 804 to $3\times10^{18}$ $cm^{-3}$ in the above-mentioned manufacturing conditions, and was placed in the same vacuum chamber as described above were the same as those shown in FIG. 5. When a voltage of 5 V was applied from the power supply 809, electron emission of about 50 pA was observed from the W surface on the high-concentration p-type semiconductor region 803. When the application voltage (device voltage) was sequentially increased up to 7 V, the emission current was also sequentially increased up to about 100 pA.

In this manner, when the carrier concentration of the p-type semiconductor region (second region) 804 is changed, the current-voltage characteristics of the semiconductor electron emission device can be regulated. When the resistance of the p-type semiconductor region 804 is decreased, the series resistance of the device can be decreased, and the operation speed can be increased.

As the semiconductor material, for example, Si, Ge, GaAs, GaP, AlAs, GaAsP, AlGaAs, SiC, BP, AlN, diamond, and the like are applicable in principle, and in particular, an indirect transition type material having a wide bandgap is suitable. As the material of the electrode 806, Al, Au, $LaB_6$, or the like may be used in place of W as long as the selected material can form a Schottky barrier junction with the p-type semiconductor. As the work function of this electrode surface is smaller, the electron emission efficiency is increased. For this reason, when the work function of the selected electrode material is large, a thin film of a material having a low work function such as Cs may be coated on the surface, thereby improving the electron emission efficiency.

[Fifth Embodiment]

Figure 9:
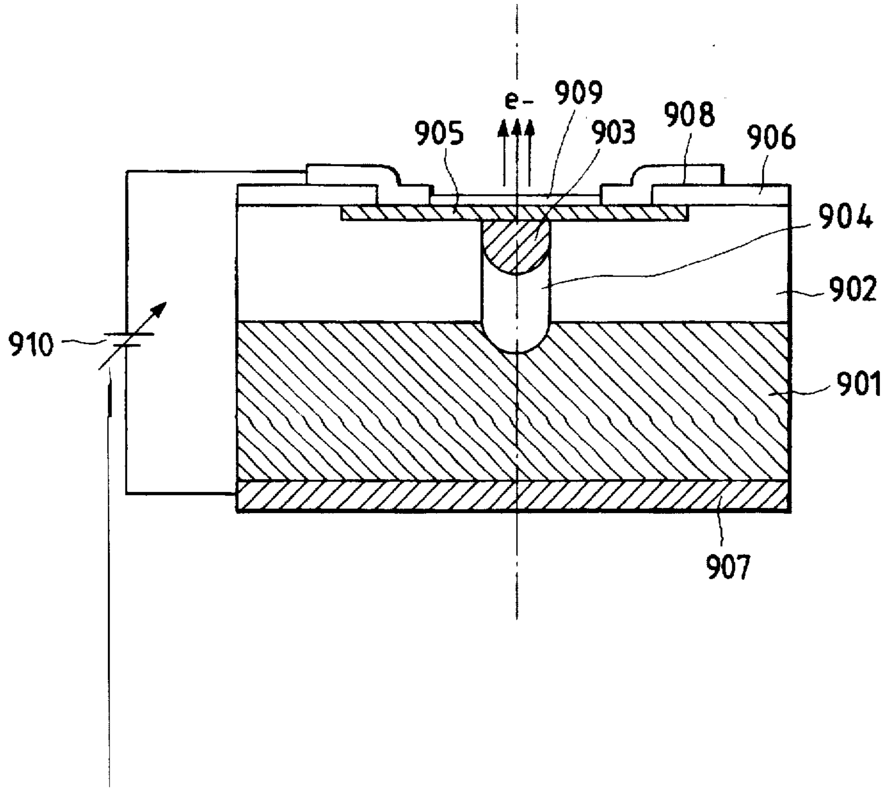
FIG. 9 is a sectional view showing a pn junction type semiconductor electron emission device according to the fifth embodiment of the present invention.

FIG. 9 is a schematic sectional view showing a semiconductor electron emission device using a pn junction according to the fifth embodiment of the present invention. The device shown in FIG. 9 comprises a high-concentration p-type semiconductor substrate 901, a low-concentration p-type semiconductor layer 902, a high-concentration p-type region semiconductor (first region) 903 for causing an avalanche breakdown, a p-type semiconductor region (second region) 904 for setting the series resistance of the device, a thin high-concentration n-type semiconductor layer 905, an insulating film 906, an ohmic contact electrode 907 for the p-type semiconductor, an ohmic contact electrode 908 for the n-type semiconductor, a coating film 909 of a low-work function material, and a power supply 910.

The manufacturing process of the semiconductor electron emission device shown in FIG. 9 will be described below.

(1) The 0.6-μm thick low-concentration p-type GaAs semiconductor layer 902 having a Be concentration of $1\times10^{15}$ $cm^{-3}$ or less was grown by the MBE method on the Zn-doped high-concentration p-type GaAs semiconductor substrate 901 having a carrier concentration of $5\times10^{18}$ $cm^{-3}$.

(2) Be ions accelerated to 40 keV were implanted in the high-concentration p-type semiconductor region 903 by the FIB implantation method so as to have a carrier concentration of $2\times10^{18}$ $cm^{-3}$ from the surface of the low-concentration p-type semiconductor layer 902 to a depth of 0.2 μm.

(3) Be ions accelerated to 160 keV were implanted in the p-type semiconductor region 904 by the FIB implantation method so that they reached the high-concentration p-type GaAs semiconductor substrate 901 to have a carrier concentration of $5\times10^{17}$ $cm^{-3}$.

(4) Si ions accelerated to 10 keV were implanted to a depth of 10 nm by a normal ion implantation method to have a carrier density of $1\times10^{19}$ $cm^{-3}$ so as to form the thin high-concentration n-type semiconductor layer 905. Electrons generated by an avalanche breakdown in the underlying high-concentration p-type semiconductor region 903 pass through the high-concentration n-type semiconductor region 905. For this reason, if this region 905 is too thick, an energy loss of the electrons is increased by scattering therein, and the electron emission amount is considerably decreased. Thus, in order to form the thin high-concentration n-type semiconductor layer, ion implantation must be performed at a low acceleration voltage, or the thickness must be decreased to 10 nm or less by etching after ion implantation.

(5) An $SiO_2$ film having a thickness of about 0.2 μm was deposited as the insulating film 906 by a normal sputtering method, and thereafter, the ion-implanted portions were activated by annealing at a temperature of 850° C. for 10 seconds.

(6) An Au/Cr film was vacuum-deposited as the ohmic contact electrode 907 on the lower surface of the substrate 901, and an Au/germanium (Ge) film was vacuum-deposited as the ohmic contact electrode 908. After these films were photolithographically etched, they were converted into an alloy by a heat treatment at a temperature of 350° C. for 5 minutes.

(7) A cesium (Cs) film as a low-work function material was deposited to have a thickness as thin as a monoatomic layer in ultra high vacuum, thus forming the coating film 909.

The semiconductor electron emission device (FIG. 9) manufactured in this manner was placed in a vacuum chamber maintained at a vacuum of $1\times10^{-11}$ Torr or less, and a voltage of 6 V was applied from the power supply 910 to the device. As a result, electron emission of about 0.1 μA was observed from the Cs surface on the high-concentration p-type semiconductor region 903. In this manner, according to the present invention, a pn junction type semiconductor electron emission device, which has electron emission characteristics equivalent to those of the conventional semiconductor electron emission device, and has a very simple structure and an easy manufacturing process, can be formed.

[Sixth Embodiment]

Figure 10A:
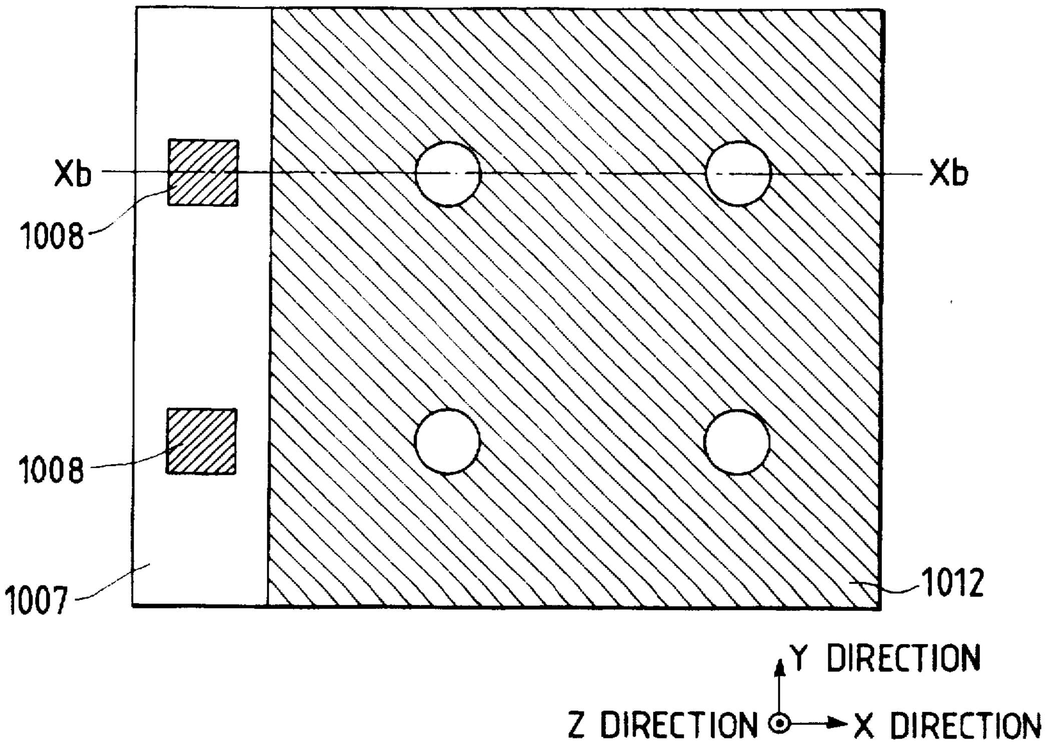
Figure 10B:
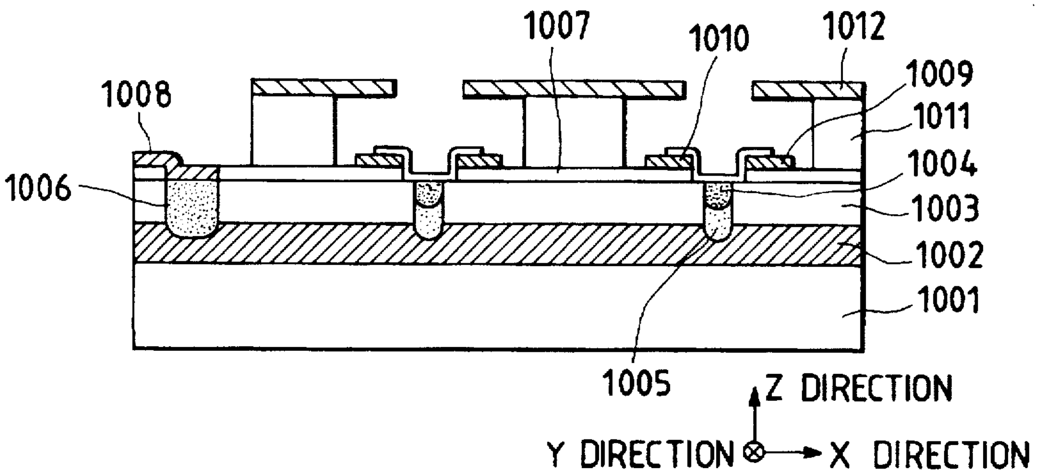

FIGS. 10A and 10B partially show a multi electron emission device on which Schottky barrier junction type semiconductor electron emission devices are aligned in a matrix according to the sixth embodiment of the present invention. FIG. 10A is a plan view of the device, and FIG. 10B is a sectional view taken along a line Xb—Xb of FIG. 10A. As shown in FIGS. 10A and 10B, the device comprises a semi-insulating semiconductor substrate 1001, a stripe-like high-concentration p-type semiconductor region 1002 elongated in the X-direction, a low-concentration p-type semiconductor region 1003, high-concentration p-type semiconductor regions 1004 for causing an avalanche breakdown, p-type semiconductor regions 1005, high-concentration p-type semiconductor regions 1006, an insulating film 1007, ohmic contact electrodes 1008 for the p-type semiconductor, stripe-like electrode wiring layers 1009 elongated in the Y-direction, Schottky electrodes 1010, support members 1011 formed of an insulating material, and a gate 1012 formed of a metallic film.

The manufacturing process of the electron emission device shown in FIGS. 10A and 10B will be described below.

(1) An inverted pattern was formed on the undoped semi-insulating GaAs semiconductor substrate 1001 having an impurity concentration of $1\times10^{14}$ $cm^{-3}$ or less by a normal photolithography technique, and thereafter, Be ions were implanted by a normal ion implantation method to have a carrier concentration of about $3\times10^{18}$ $cm^{-3}$. The resultant structure was annealed at a temperature of 850° C. for 10 seconds, thereby forming the stripe-like high-concentration p-type semiconductor region 1002 elongated in the X-direction.

(2) The 0.6-μm thick low-concentration p-type GaAs semiconductor layer 1003 having a Be concentration of $1\times10^{15}$ $cm^{-3}$ or less was grown by the MBE method.

(3) Be ions accelerated to 40 keV were implanted in the high-concentration p-type semiconductor regions 1004 by the FIB implantation method to have a carrier concentration of $2\times10^{18}$ $cm^{-3}$. Be ions accelerated to 160 keV were implanted in the p-type semiconductor regions 1005 by the FIB implantation method to have a carrier concentration of $5\times10^{17}$ $cm^{-3}$.

(4) Be ions accelerated to 160 kev and 40 keV were implanted in the high-concentration p-type semiconductor regions 1006 by the FIB implantation method so as to have almost a uniform carrier concentration of $3\times10^{18}$ $cm^{-3}$ from the surface of the low-concentration p-type semiconductor layer 1003 to the high-concentration p-type semiconductor region 1002.

The FIB implantation processes and the MBE growth process in the above-mentioned processes (1) to (4) were performed without being exposed to the outer air since corresponding apparatuses were connected through a vacuum tunnel. Upon completion of these implantation processes, the ion-implanted portions 1004, 1005, and 1006 were activated by annealing at a temperature of 850° C. for 10 seconds.

(5) A 0.2-μm thick $SiO_2$ film was deposited as the insulating film 1007 by a normal sputtering method, and thereafter, corresponding opening portions were formed by a normal photolithographic etching method.

(6) An Au/Cr film was vacuum-deposited on the high-concentration p-type semiconductor region 1006, and was annealed at a temperature of 350° C. for 5 minutes, thereby forming the ohmic contact electrode 1008.

(7) Aluminum (Al) was used as a material for forming electrode wiring layers, and W was used as a material for forming a Schottky barrier junction with the p-type GaAs semiconductor. A 0.5-μm thick Al film and an 8-nm thick W film were deposited by the electron beam deposition, and were photolithographically etched to form the electrode wiring layers 1009, and the Schottky electrodes 1010.

(8) As the support members 1011 formed of an insulating material, and the gate 1012, an $SiO_2$ film and a W film were sequentially deposited by the vacuum deposition method, and were photolithographically etched.

The multi semiconductor electron emission device on which 20 (X-direction)×10 (Y-direction) electron emission portions manufactured in this manner were aligned in a matrix was placed in a vacuum chamber maintained at a vacuum of about $1\times10^{-7}$ Torr, and a reverse bias voltage of 7 V was applied to the entire multi electron emission device. As a result, electron emission of a total of about 20 nA was observed. It was confirmed that when a voltage was applied across an arbitrary ohmic contact electrode 1008 and an arbitrary electrode wiring layer 1009, only a device at the intersection emitted electrons. In this manner, according to the present invention, a device, which has electron emission characteristics equivalent to those of the conventional multi semiconductor electron emission device, and has a very simple structure and an easy manufacturing process, can be formed.

[Seventh Embodiment]

Figure 11:
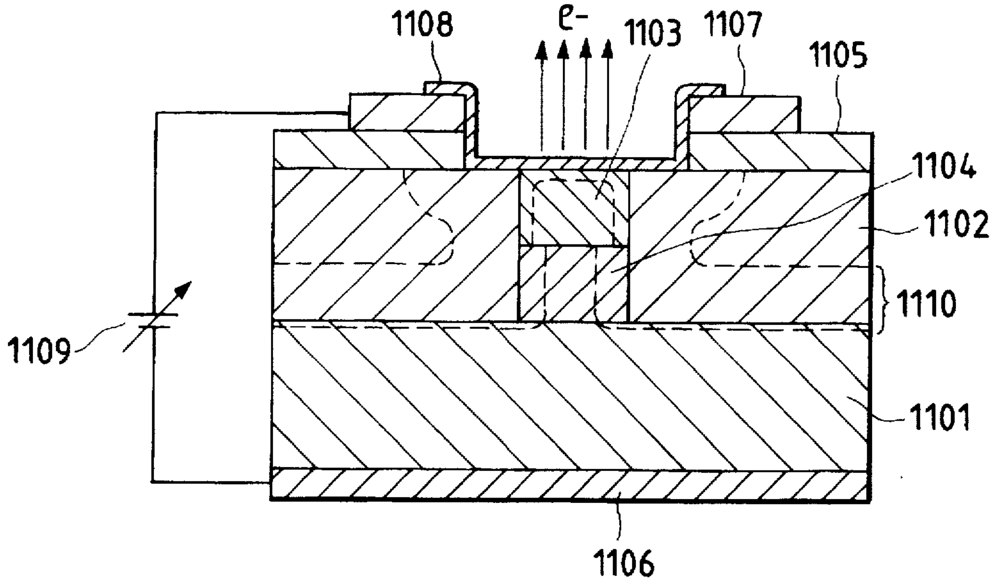
FIG. 11 is a sectional view showing a Schottky barrier junction type semiconductor electron emission device according to the seventh embodiment of the present invention.

FIG. 11 is a sectional view showing a Schottky barrier junction type semiconductor electron emission device according to the seventh embodiment of the present invention.

The semiconductor electron emission device of this embodiment is a Schottky barrier junction type device having the following structure. That is, a cylindrical high-concentration p-type semiconductor region 1103 as a first p-type semiconductor region and a p-type semiconductor region 1104 as a second p-type semiconductor region for supplying carriers to the high-concentration p-type semiconductor region 1103 are formed at substantially the central portion on a high-concentration p-type semiconductor substrate 1101 to be in contact with each other. A low-concentration n-type semiconductor region 1102 as an n-type semiconductor region is formed outwardly concentrically around the high-concentration p-type semiconductor region 11.03 and the p-type semiconductor region 1104. A Schottky electrode 1108 as a metallic film for forming a Schottky barrier junction with the high-concentration p-type semiconductor region 1103 is formed on the device surface.

Furthermore, the semiconductor electron emission device of this embodiment comprises an ohmic contact electrode 1106 for the high-concentration p-type semiconductor substrate 1101, and an electrode wiring layer 1107 for the Schottky electrode 1108 so as to apply a reverse bias voltage to the Schottky barrier junction. The reverse bias voltage is applied from a power supply 1109.

Note that the electrode wiring layer 1107 contacts the Schottky electrode 1108 on an insulating film 1105 formed on the low-concentration n-type semiconductor region 1102 so as to prevent short-circuiting with the above-mentioned p-type semiconductor regions. In FIG. 11, the shape of a depletion layer edge in a state wherein the reverse bias voltage is applied is designated by 1110.

The details of the manufacturing process of the semiconductor electron emission device shown in FIG. 11 will be described below.

(1) A 0.6-μm thick low-concentration n-type GaAs semiconductor layer having a silicon (Si) concentration of $1\times10^{15}$ $cm^{-3}$ or less was grown on the zinc (Zn)-doped high-concentration p-type semiconductor substrate 1101 (GaAs) having a carrier concentration of $5\times10^{18}$ $cm^{-3}$ by the molecular beam epitaxy (MBE) method. This low-concentration n-type GaAs semiconductor layer forms the low-concentration n-type semiconductor region 1102 later.

(2) Be ions accelerated to 40 keV were implanted in a region corresponding to the high-concentration p-type semiconductor region 1103 by the focused ion beam (FIB) implantation method so as to have almost a uniform Be concentration of $2\times10^{18}$ $cm^{-3}$.

(3) Be ions accelerated to 160 keV were implanted in a region corresponding to the p-type semiconductor region 1104 by the FIB implantation method so that they reached the high-concentration p-type semiconductor substrate 1101 to have a Be concentration of $1\times10^{18}$ $cm^{-3}$.

(4) After an $SiO_2$ film having a thickness of about 0.2 μm was deposited as the insulating film 1105 by the sputtering method, the ion-implanted portions were activated by annealing at a temperature of 850° C. for 10 seconds.

(5) A gold (Au)/chromium (Cr) film was vacuum-deposited on the lower surface of the high-concentration p-type semiconductor substrate 1101, and was annealed at a temperature of 350° C. for 5 minutes, thereby forming the ohmic contact electrode 1106.

(6) An aluminum film was deposited on the insulating film 1105, and was photolithographically etched to form the electrode wiring layer 1107 and an opening portion of the insulating film 1105.

(7) Tungsten (W) was selected as a material for forming a Schottky barrier junction with the p-type semiconductor region 1104 and the high-concentration p-type semiconductor region 1103, each consisting of the p-type GaAs semiconductor, and the 8-nm thick Schottky electrode 1108 was formed in the above-mentioned opening portion by electron beam deposition and normal photolithography.

The semiconductor electron emission device manufactured in this manner was placed in a vacuum chamber maintained at a vacuum of about $1\times10^{-7}$ Torr, and a voltage of 7 V was applied from the power supply 1109 across the ohmic contact electrode 1106 and the electrode wiring layer 1107. As a result, electron emission of about 15 pA was observed from the surface of the Schottky electrode 1108 on the high-concentration p-type semiconductor region 1103. When the application voltage (device voltage) was sequentially increased up to 10 V, the electron emission amount (emission current) was also sequentially increased up to about 100 pA as in FIG. 4. It is considered that the depletion layer 1110 upon application of the device voltage is widened by about 0.04 μm from the Schottky barrier interface with the Schottky electrode 1108 in the high-concentration p-type semiconductor region 1103. Since a portion around the high-concentration p-type semiconductor region 1103 is protected by the thick depletion layer formed by a pn junction, an electric field is most concentrated on a portion of the high-concentration p-type semiconductor region 1103, and an avalanche breakdown efficiently occurs in this region.

The electrical characteristics obtained when a semiconductor electron emission device was manufactured while changing only the Be concentration of the p-type semiconductor region 1104 as the second p-type semiconductor region for supplying carriers to the high-concentration p-type semiconductor region 1103 as the first p-type semiconductor region to $3\times10^{18}$ $cm^{-3}$ in the above-mentioned manufacturing conditions, and was placed in the same vacuum chamber as described above, were the same as those shown in FIG. 5. When a device voltage of 5 V was applied from the power supply 1109 to this semiconductor electron emission device, electron emission (emission current) of about 50 pA was observed from the surface of the Schottky electrode 1108 on the high-concentration p-type semiconductor region 1103. When the device voltage was sequentially increased up to 7 V, the emission current was also sequentially increased up to about 100 pA.

In this embodiment, another electrode may be formed on the electrode wiring layer 1107 through an insulating film so as to set a potential difference between this electrode and the electrode wiring layer 1107. With this structure, the flying direction and kinetic energy of the electrons emitted from the electron emission portion can be regulated.

In this manner, when the carrier concentration of the p-type semiconductor region 1104 is changed, the current-voltage characteristics of the semiconductor electron emission device can be regulated. When the resistance of the p-type semiconductor region 1104 is decreased, the series resistance of the device can be decreased, and the operation speed can be increased.

In the above-mentioned embodiment, GaAs is used as a semiconductor. As other semiconductor materials, for example, Si, Ge, GaP, AlAs, GaAsP, AlGaAs, SiC, BP, AlN, diamond, and the like are applicable in principle, and in particular, an indirect transition type material having a wide bandgap is suitable.

As the material of the ohmic contact electrode 106, in place of tungsten (W), Al, Au, $LaB_6$, and the like may be used as long as they can form a Schottky barrier junction with the p-type semiconductor. In this case, as described above, as the work function of this electrode surface is smaller, the electron emission efficiency is increased. For this reason, when the work function of the selected electrode material is large, a thin film of a material having a low work function such as Cs may be coated on the surface, thereby improving the electron emission efficiency.

[Eighth Embodiment]

Figure 12:
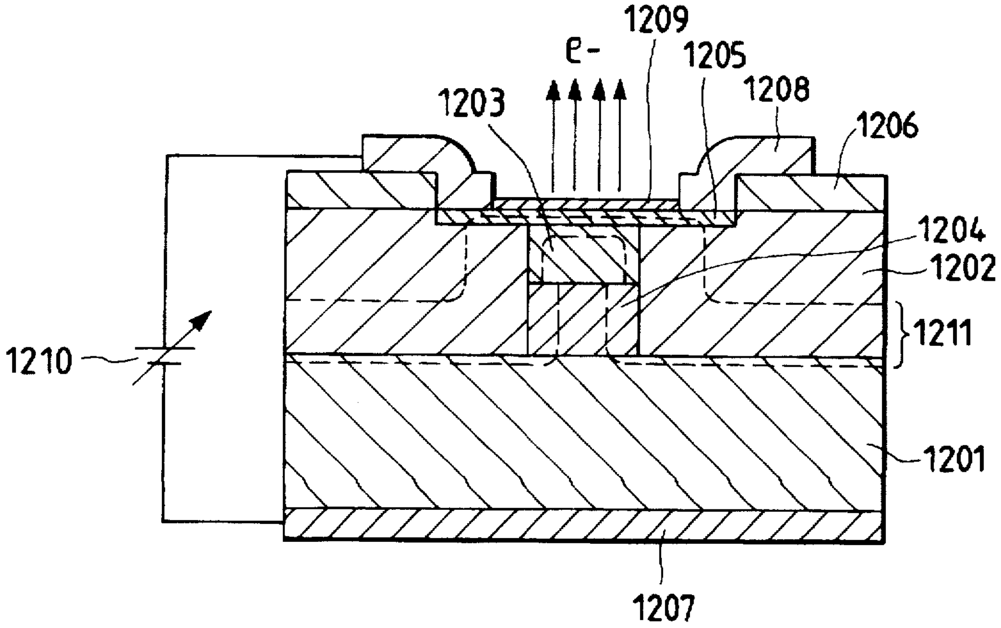
FIG. 12 is a sectional view showing a pn junction type semiconductor electron emission device according to the eighth embodiment of the present invention.

FIG. 12 is a sectional view showing a pn junction type semiconductor electron emission device according to the eighth embodiment of the present invention.

The semiconductor electron emission device of this embodiment is a pn junction type device comprising an electron emission portion having the following structure. That is, in the electron emission portion, a cylindrical high-concentration p-type semiconductor region 1203 as a first p-type semiconductor region, and a p-type semiconductor region 1204 as a second p-type semiconductor region for supplying carriers to the high-concentration p-type semiconductor region 1203 are formed at substantially the central portion on a high-concentration p-type semiconductor substrate 1201 to be in contact with each other. A low-concentration n-type semiconductor region 1202 as a second n-type semiconductor region is arranged outwardly concentrically around the high-concentration p-type semiconductor region 1203 and the p-type semiconductor region 1204. In addition, a high-concentration n-type semiconductor region 1205 as a first n-type semiconductor region for forming a pn junction with the high-concentration p-type semiconductor region 1203 is formed on the high-concentration p-type semiconductor region 1203.

Furthermore, the semiconductor electron emission device of this embodiment comprises an ohmic contact electrode 1207 for the high-concentration p-type semiconductor substrate 1201, an ohmic contact electrode 1208 for the high-concentration n-type semiconductor region 1205, and a low-work function coating film 1209 formed on the surface of the high-concentration n-type semiconductor region 1205 so as to apply a reverse bias voltage to the pn junction portion. The reverse bias voltage is applied from a power supply 1210.

Note that the ohmic contact electrode 1208 contacts the high-concentration n-type semiconductor region 1205 through an insulating film 1206 formed along the surface edge portion of the low-concentration n-type semiconductor region 1202 so as to prevent short-circuiting with the low-concentration n-type semiconductor region 1202. In FIG. 12, the shape of a depletion layer edge in a state wherein the reverse bias voltage is applied is designated by 1211.

The details of the manufacturing process of the pn junction type semiconductor electron emission device according to this embodiment will be described below.

(1) A 0.6-μm thick low-concentration n-type GaAs semiconductor layer having an Si concentration of $5\times10^{15}$ $cm^{-3}$ or less was grown by the MBE method on the Zn-doped high-concentration p-type semiconductor substrate 1201 having a carrier concentration of $5\times10^{18}$ $cm^{-3}$. The low-concentration n-type GaAs semiconductor layer forms the low-concentration n-type semiconductor region 1202 later.

(2) Be ions accelerated to 40 keV were implanted in a region corresponding to the high-concentration p-type semiconductor region 1203 by the FIB implantation method so as to have almost a uniform Be concentration of $2\times10^{18}$ $cm^{-3}$.

(3) Be ions accelerated to 160 keV were implanted in a region corresponding to the p-type semiconductor region 1204 by the FIB implantation method so that they reached the high-concentration p-type semiconductor substrate 1201 to have a Be concentration of $5\times10^{17}$ $cm^{-3}$.

(4) Si ions accelerated to 10 keV were implanted in a region corresponding to the high-concentration n-type semiconductor region 1205 to a depth of 10 nm by a normal ion implantation method so as to have an Si concentration of about $1\times10^{19}$ $cm^{-3}$. Electron generated by an avalanche breakdown in the high-concentration p-type semiconductor region 1203 below the high-concentration n-type semiconductor region 1205 pass through the high-concentration n-type semiconductor region 1205. For this reason, when the region 1205 is formed too thick, an energy loss is increased by scattering therein, and electron emission efficiency is impaired. Thus, it is preferable to decrease the thickness of the region 1205 to 10 nm or less by performing ion implantation at a low acceleration voltage or by etching the surface after the ion implantation. Upon formation of the high-concentration n-type semiconductor region 1205, the electron emission portion consisting of a pn junction with the high-concentration p-type semiconductor region is formed.

(5) An $SiO_2$ film having a thickness of about 0.2 μm was deposited as the insulating film 1206 by a sputtering method, and thereafter, the ion-implanted portions were activated by annealing at a temperature of 850° C. for 10 seconds.

(6) An Au/Cr film was vacuum-deposited on the lower surface of the high-concentration p-type semiconductor substrate 1201 as the ohmic contact electrode 1207 for the high-concentration p-type semiconductor substrate 1201, and an Au/Ge film was vacuum-deposited as the ohmic contact electrode 1208 for the high-concentration n-type semiconductor region 1205. These films were photolithographically etched, and were converted into an alloy by a heat treatment at a temperature of 350° C. for 5 minutes.

(7) A cesium (Cs) film as a low-work function material was deposited on an exposed portion of the high-concentration n-type semiconductor region 1205 in ultra high vacuum to have a thickness as thin as a monoatomic layer, thereby forming the low-work function coating film 1209.

The semiconductor electron emission device manufactured in this manner was placed in a vacuum chamber maintained at a vacuum of about $1\times10^{-11}$ Torr or less, and a device voltage of 6 V was applied from the power supply 1210 across the ohmic contact electrodes 1207 and 1208. As a result, electron emission of about 0.1 μA was observed from the surface of the low-work function coating film 1209 (Cs) on the high-concentration n-type semiconductor region 1205. In this manner, according to this embodiment, a pn junction type semiconductor electron emission device, which has electron emission characteristics equivalent to those of the conventional semiconductor electron emission device, and has an easy manufacturing process, can be formed.

In this embodiment, when a potential difference is set between the ohmic contact electrode 1208 and another electrode, the flying direction and kinetic energy of electrons can be regulated like in the seventh embodiment.

[Ninth Embodiment]

Figure 13A:
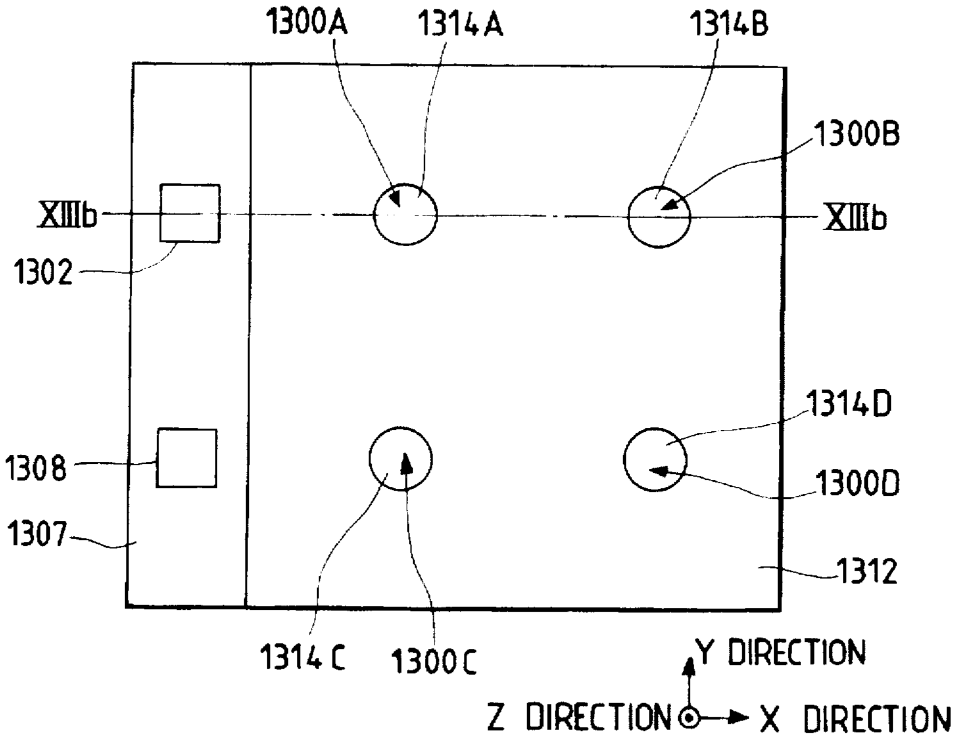
Figure 13B:
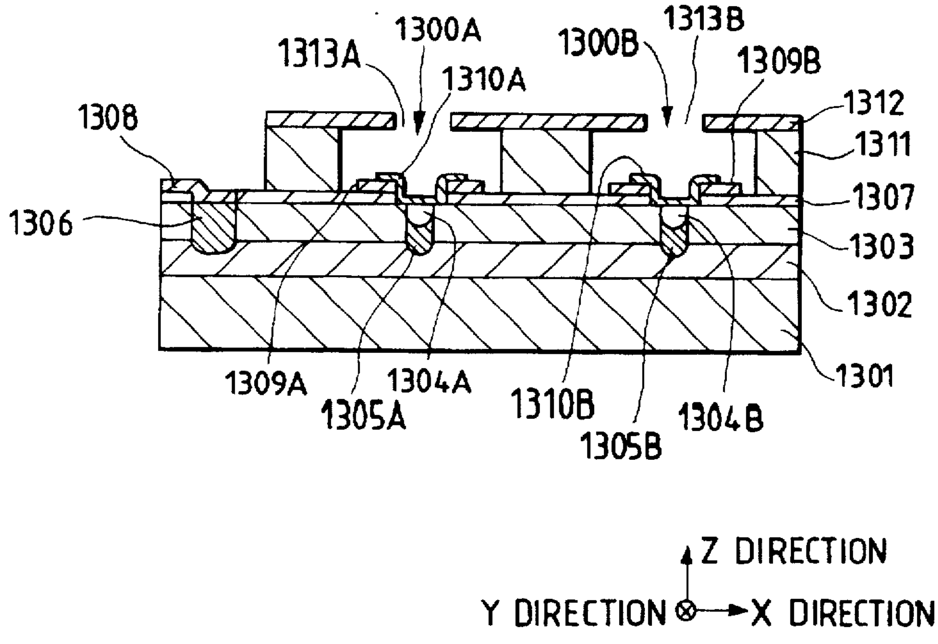

FIG. 13 shows a Schottky barrier type multi semiconductor electron emission device on which a plurality of electron emission portions are formed according to the ninth embodiment of the present invention. FIG. 13A is a plan view of the device, and FIG. 13B is a sectional view taken along a line XIIIb—XIIIb of FIG. 13A.

In the multi semiconductor electron emission device of this embodiment, four electron emission portions 1300A, 1300B, 1300C, and 1300D are formed in a matrix on a high-concentration p-type semiconductor region 1302 formed on a semiconductor substrate 1301.

Since the electron emission portions 1300A, 1300B, 1300C, and 1300D have the same structure, the electron emission portion 1300A will be exemplified below.

The electron emission portion 1300A has the same structure as that of the device of the seventh embodiment. That is, the portion 1300A comprises a high-concentration p-type semiconductor region 1304A as a first p-type semiconductor region, a p-type semiconductor region 1305A as a second p-type semiconductor region, contacting the high-concentration p-type semiconductor region 1304A, for supplying carriers to the high-concentration p-type semiconductor region 1304A, a low-concentration n-type semiconductor region 1303 as an n-type semiconductor region formed around the high-concentration p-type semiconductor region 1304A and the p-type semiconductor region 1305A, and a Schottky electrode 1310A for forming a Schottky barrier junction with the high-concentration p-type semiconductor region 1304A.

Furthermore, an ohmic contact electrode 1308 for the high-concentration p-type semiconductor region 1302 and an electrode wiring layer 1309A for the Schottky electrode 1310A were formed so as to apply a reverse bias voltage to the Schottky barrier junction. The electrode wiring layer 1309A contacts the Schottky electrode 1310A on an insulating film 1307 formed on the low-concentration n-type semiconductor region 1303 so as to prevent short-circuiting with the above-mentioned p-type semiconductor regions.

The ohmic contact electrode 1308 is connected to the high-concentration p-type semiconductor region 1302 through a high-concentration p-type semiconductor region 1306. In this embodiment, as shown in FIG. 13A, two ohmic contact electrodes 1308 are formed. The ohmic contact electrodes 1308 are common to the four electron emission portions 1300A, 1300B, 1300C, and 1300D.

The Schottky electrode 1310A may be commonly connected to Schottky electrodes 1310B, 1310C, and 1310D (1310C and 1310D are not shown) of the remaining electron emission portions 1300B, 1300C, and 1300D. In this case, since the ohmic contact electrodes 1308 are commonly connected, the electron emission operations of the four electron emission portions 1300A, 1300B, 1300C, and 1300D are simultaneously controlled. When the Schottky electrodes 1310A, 1310B, 1310C, and 1310D of the electron emission portions 1300A, 1300B, 1300C, and 1300D are independently formed, the electron emission portions 1300A, 1300B, 1300C, and 1300D can be controlled independently.

The device surface formed with the four electron emission portions 1300A, 1300B, 1300C, and 1300D with the above-mentioned structure is covered with a gate 1312 consisting of a metallic film through a support member 1311 formed on the insulating film 1307, and formed of an insulating material, except for the ohmic contact electrodes 1308. Opening portions 1313A, 1313B, 1313C, and 1313D are formed in the gate 1312 at corresponding positions above the electron emission portions 1300A, 1300B, 1300C, and 1300D. Electrons emitted from the electron emission portions 1300A, 1300B, 1300C, and 1300D are externally discharged through the opening portions 1313A, 1313B, 1313C, and 1313D.

The details of the manufacturing process of the multi semiconductor electron emission device of this embodiment will be described below.

(1) An inverted pattern was formed on the undoped semi-insulating semiconductor substrate 1301 (GaAs) having an impurity concentration of $1\times10^{14}$ $cm^{-3}$ or less by a normal photolithography technique, and thereafter, normal ion implantation was performed to have a Be concentration of $3\times10^{18}$ $cm^{-3}$.

The resultant structure was annealed at a temperature of 850° C. for 10 seconds, thereby forming the stripe-like high-concentration p-type semiconductor region 1302 elongated in the X-direction.

(2) A 0.6-μm thick GaAs film was grown by the MBE method as the low-concentration n-type semiconductor region 1303 having an Si concentration of $1\times10^{15}$ $cm^{-3}$.

(3) Be ions accelerated to 40 keV and 160 keV were respectively implanted by the FIB implantation method in regions corresponding to the high-concentration p-type semiconductor regions 1304A, 1304B, 1304C, and 1304D to have a Be concentration of $2\times10^{18}$ $cm^{-3}$, and in regions corresponding to the p-type semiconductor regions 1305A, 1305B, 1305C, and 1305D to have a Be concentration of $5\times10^{17}$ $cm^{-3}$.

(4) Be ions were implanted by the FIB implantation method in a region corresponding to the high-concentration p-type semiconductor region 1306 so as to have almost a uniform Be concentration of $3\times10^{18}$ $cm^{-3}$ from the low-concentration n-type semiconductor region 1303 to the high-concentration p-type semiconductor region 1302.

The FIB implantation processes and the MBE growth process in the above-mentioned processes (1) to (4) were performed without being exposed to the outer air since corresponding apparatuses were connected through a vacuum tunnel.

Furthermore, the high-concentration p-type semiconductor regions 1304A, 1304B, 1304C, and 1304D, the p-type semiconductor regions 1305A, 1305B, 1305C, and 1305D, and the high-concentration p-type semiconductor region 1306 were activated by annealing at a temperature of 850° C. for 10 seconds.

(5) A 0.2-μm thick $SiO_2$ film as the insulating film 1307 was deposited by a normal sputtering method on the low-concentration n-type semiconductor region 1303 subjected to the above-mentioned ion implantation. Thereafter, corresponding openings were formed in the $SiO_2$ film by normal photolithographic etching.

(6) An Au/Cr film was vacuum-deposited on the high-concentration p-type semiconductor region 1306, and was annealed at a temperature of 350° C. for 5 minutes, thereby forming the ohmic contact electrodes 1308.

(7) A 0.5-μm thick aluminum (Al) film as the electrode wiring layers 1309A, 1309B, 1309C, and 1309D, and an 8-nm thick tungsten (W) film as a material for forming Schottky barrier junctions with the high-concentration p-type semiconductor regions 1304A, 1304B, 1304C, and 1304D were deposited by electron beam deposition, and were photolithographically etched to form the electrode wiring layers 1309A, 1309B, 1309C, and 1309D, and the Schottky electrodes 1310A, 1310B, 1310C, and 1310D.

(8) As the support members 1311 formed of an insulating material, and the gate 1312, an $SiO_2$ film and a tungsten (W) film were sequentially deposited by the vacuum deposition method, and were photolithographically etched to form the opening portions 1313A, 1313B, 1313C, and 1313D.

With the above-mentioned processes (1) to (8), the multi semiconductor electron emission device having the four electron emission portions 1300A, 1300B, 1300C, and 1300D was completed.

Following the same procedures as above, a multi semiconductor electron emission device on which 20 (X-direction)×10 (Y-direction) electron emission portions were aligned in a matrix was manufactured, was placed in a vacuum chamber maintained at a vacuum of about $1\times10^{-7}$ Torr, and a reverse bias voltage of 7 V was applied to all the electron emission portions. As a result, electron emission of a total of about 20 nA was observed. It was confirmed that when a reverse bias voltage was applied across an arbitrary ohmic contact electrode 1308 and an arbitrary electrode wiring layer 1309, a device at the intersection emitted electrons. In this manner, according to this embodiment, an electron emission device, which has electron emission characteristics equivalent to those of the conventional multi semiconductor electron emission device, and can be easily manufactured, can be formed.

With the above-mentioned arrangements, the present invention can provide the following effects.

(1) Since the semi-insulating region is formed around the first p-type semiconductor region forming the Schottky barrier junction or pn junction in the electron emission portion, the depletion region formed in the first p-type semiconductor region is contiguously connected to and protected by the semi-insulating region. For this reason, a semiconductor electron emission device having a very simple structure requiring no guard ring structure unlike in a conventional device can be provided.

(2) Since the device structure can be simplified, as described above, the device size can be reduced, and the manufacturing process can also be simplified.

(3) Since the depletion region is protected by the semi-insulating region, an avalanche breakdown efficiently occurs in only the first p-type semiconductor region, thus improving electron emission efficiency.

(4) When the carrier concentration of the second p-type semiconductor region for supplying carriers to the first p-type semiconductor region is set to be equal to or higher than that of the first p-type semiconductor region, the series resistance of the device can be greatly reduced, and a semiconductor electron emission device having a high operation speed can be realized.

The high-concentration p-type semiconductor region (first region) for causing an avalanche breakdown contacts the p-type semiconductor region (second region) for supplying carriers to the first region, and the p-type semiconductor region (third region) for forming a Schottky barrier junction or pn junction is formed around the first region. When the device with this structure is manufactured to have the above-mentioned carrier concentrations in these regions, a very simple device structure requiring no high-concentration n-type semiconductor guard ring structure unlike in a conventional device can be realized. Upon realization of the simple device structure, the device size can be reduced, and the manufacturing process of the device can be simplified.

When the low-concentration n-type semiconductor region is formed outside the first p-type semiconductor region having a high carrier concentration, the depletion layer can have a shape with which an electric field can be most easily concentrated on the first p-type semiconductor region. With this structure, since an avalanche breakdown occurs in only the first p-type semiconductor region, a guard ring structure formed in the prior art, and an ohmic contact electrode therefor can be omitted. As a result, the device size can be reduced, and the manufacturing process can be simplified as well as the device structure.

When the carrier concentration of the second p-type semiconductor region for supplying carriers to the first p-type semiconductor region is increased, the series resistance of the device can be decreased. Therefore, a semiconductor electron emission device having a high operation speed can be provided.

What is claimed is:

1. A semiconductor electron emission device having an electron emission portion for causing an avalanche breakdown by applying a reverse bias voltage to a Schottky barrier junction formed between a metallic material or a metallic compound material and a first p-type semiconductor region, and externally emitting electrons from a solid-state surface of said metallic material or said metallic compound material, comprising a structure in which said first p-type semiconductor region for causing the avalanche breakdown contacts a second p-type semiconductor region for supplying carriers to said first region, and a third p-type semiconductor region is formed around and in contact with said first p-type semiconductor region, wherein carrier concentrations of said first, second, and third regions satisfy a relationship, wherein, the second region is greater than the first region and the first region is greater than the third region.

2. A semiconductor electron emission device, having an electron emission portion for causing an avalanche breakdown by applying a reverse bias voltage to a pn junction between an n-type semiconductor and a first p-type semiconductor region, and externally emitting electrons from a solid-state surface of the n-type semiconductor, comprising a structure in which said first p-type semiconductor region for causing the avalanche breakdown contacts a second p-type semiconductor region for supplying carriers to said first region, and a third p-type semiconductor region is formed around and in contact with said first p-type semiconductor region, wherein carrier concentrations of said first, second, and third regions satisfy a relationship, wherein the second region is greater than the first region which is greater than the third region.

3. A semiconductor electron emission device having an electron emission portion for causing an avalanche breakdown by applying a reverse bias voltage to a Schottky barrier junction formed between a metallic material or a metallic compound material and a first p-type semiconductor region, and externally emitting electrons from a solid-state surface of said metallic material or said metallic compound material, comprising a structure in which said first p-type semiconductor region for causing the avalanche breakdown contacts a second p-type semiconductor region for supplying carriers to said first region, and a third p-type semiconductor region is formed around and in contact with said first p-type semiconductor region, wherein carrier concentrations of said first, second, and third regions satisfy a relationship, wherein the first region is greater than the second region and the second region is greater than the third region.

4. A device according to claim 3, wherein an electrode for regulating a direction and potential energy of the electrons emitted from the electron emission portion is formed near said solid-state surface.

5. A device according to claim 3, wherein a material having a work function different from a work function of the metallic material or the metallic compound material is deposited on a surface of the metallic material or the metallic compound material.

6. A device according to claim 3, wherein one of said first, second, and third regions is formed by an ion implantation method.

7. A plurality of semiconductor electron emission devices of claim 3 formed on a single substrate.

8. A device according to claim 7, wherein the electron emission portions of said plurality of semiconductor electron emission devices are electrically isolated from each other, and can independently emit electrons.

9. A semiconductor electron emission device having an electron emission portion for causing an avalanche breakdown by applying a reverse bias voltage to a pn junction between an n-type semiconductor and a first p-type semiconductor region, and externally emitting electrons from a solid-state surface of the n-type semiconductor, comprising a structure in which said first p-type semiconductor region for causing the avalanche breakdown contacts a second p-type semiconductor region for supplying carriers to said first region, and a third p-type semiconductor region is formed around and in contact with said first p-type semiconductor region, wherein carrier concentrations of said first, second, and third regions satisfy a relationship, wherein the first region is greater than the second region and the second region is greater than the third region.

10. A device according to claim 9, wherein an electrode for regulating a direction and potential energy of the electrons emitted from the electron emission portion formed near said solid-state surface.

11. A device according to claim 9, wherein a material, having a work function different from a work function of the n-type semiconductor is deposited on a surface of the n-type semiconductor.

12. A device according to claim 9, wherein one of said first, second, and third regions is formed by an ion implantation method.

13. A device according to claim 9, wherein a thickness of the n-type semiconductor of said electron emission portion is not more than 10 nm.

14. A plurality of semiconductor electron emission devices of claim 9 formed on a single substrate.

15. A device according to claim 14, wherein electron emission portions of said plurality of semiconductor electron emission devices are electrically isolated from each other, and can independently emit electrons.

16. A semiconductor electron emission device, having an electron emission portion formed by a Schottky barrier junction between a metallic material or a metallic compound material and a semiconductor, for emitting electrons from a solid-state surface of said metallic material or said metallic compound material, wherein said electron emission portion comprises:

a first p-type semiconductor region for forming the Schottky barrier junction to cause an avalanche breakdown;

a second p-type semiconductor region, contacting said first p-type semiconductor region, for supplying carriers to said first p-type semiconductor region; and an n-type semiconductor region located around and in contact with said first p-type semiconductor region to form a pn junction with said first p-type semiconductor region, and carrier concentrations of said first and second p-type semiconductor regions and said n-type semiconductor region satisfy a relationship wherein, the first p-type semiconductor region is greater than the second p-type semiconductor region and the second p-type semiconductor region is greater than the n-type semiconductor region.

17. A device according to claim 16, wherein an electrode for regulating a direction of the electrons emitted from said electron emission portion is formed near the solid-state surface.

18. A device according to claim 16, wherein electrode for regulating potential energy of the electrons emitted from said electron emission portion is formed near the solid-state surface.

19. A device according to claim 16, wherein a material having a work function different from a work function of the metallic material or the metallic compound material is deposited on a surface of the metallic material or the metallic compound material forming the Schottky barrier junction in said electron emission portion.

20. A device according to claim 16, wherein said electron emission portion is formed on a semiconductor substrate.

21. A device according to claim 16, wherein said first and second p-type semiconductor regions and said n-type semiconductor region of said electron emission portion are formed by an ion implantation method.

22. A device according to claim 16, wherein a plurality of said electron emission portions are formed on a single substrate.

23. A device according to claim 22, wherein said substrate comprises a semiconductor substrate.

24. A device according to claim 22, wherein said plurality of electron emission portions are electrically isolated from each other, and can independently emit electrons.

25. A semiconductor electron emission device, having an electron emission portion formed by a Schottky barrier junction between a metallic material or a metallic compound material and a semiconductor, for emitting electrons from a solid-state surface of said metallic material or said metallic compound material, wherein said electron emission portion comprises:

a first p-type semiconductor region for forming the Schottky barrier junction to cause an avalanche breakdown;

a second p-type semiconductor region, contacting said first p-type semiconductor region, for supplying carriers to said first p-type semiconductor region; and an n-type semiconductor region located around and in contact with said first p-type semiconductor region to form a pn junction with said first p-type semiconductor region, and carrier concentrations of said first and second p-type semiconductor regions and said n-type semiconductor region satisfy a relationship, wherein the second p-type semiconductor region is greater than the first p-type semiconductor region which is greater than the n-type semiconductor region.

26. A device according to claim 25, wherein an electrode for regulating a direction of the electron emitted from said electron emission portion is formed near the solid state surface.

27. A device according to claim 25, wherein an electrode for regulating potential energy of the electrons emitted from said electron emission portion is formed near the solid state surface.

28. A device according to claim 25, wherein a material having a work function different from a work function of the metallic material or the metallic compound material is deposited on a surface of the metallic material or the metallic compound material forming the Schottky barrier junction in said electron emission portion.

29. A device according to claim 25, wherein said electron emission portion is formed on a semiconductor substrate.

30. A device according to claim 25, wherein said first and second p-type semiconductor regions and said n-type semiconductor region of said electron emission portion are formed by an ion implantation method.

31. A device according to claim 25, wherein a plurality of said electron emission portions are formed on a single substrate.

32. A device according to claim 31, wherein said substrate comprises a semiconductor substrate.

33. A device according to claim 31, wherein said plurality of electron emission portions are electrically isolated from each other, and can independently emit electrons.

34. A semiconductor electron emission device, having an electron emission portion formed by a pn junction between a first n-type semiconductor region and a first p-type semiconductor region, for emitting electrons from a solid-state surface of the first n-type semiconductor region, wherein said electron emission portion comprises:

said first n-type semiconductor region;

said first p-type semiconductor region for forming the pn junction with said first n-type semiconductor region to cause an avalanche breakdown;

a second p-type semiconductor region, contacting said first p-type semiconductor region, for supplying carriers to said first p-type semiconductor region; and a second n-type semiconductor region located around and in contact with said first p-type semiconductor region to form a pn junction with said first p-type semiconductor region, and carrier concentrations of said first and second p-type semiconductor regions and said first and second n-type semiconductor regions satisfy a relationship when, the first n-type semiconductor region is greater than the first p-type semiconductor region which is greater than the second p-type semiconductor region which is greater than the second n-type semiconductor region.

35. A device according to claim 34, wherein an electrode for regulating a direction of the electrons emitted from said electron emission portion is formed near the solid-state surface.

36. A device according to claim 34, wherein an electrode for regulating potential energy of the electrons emitted from said electron emission portion is formed near the solid-state surface.

37. A device according to claim 34, wherein a material having a work function different from a work function of said first n-type semiconductor region is deposited on a surface of said first n-type semiconductor region of said electron emission portion.

38. A device according to claim 34, wherein said electron emission portion is formed on a semiconductor substrate.

39. A device according to claim 34, wherein said first and second p-type semiconductor regions and said first and second n-type semiconductor regions are formed by an ion implantation method.

40. A device according to claim 34, wherein a thickness of the n-type semiconductor of said electron emission portion is not more than 10 nm.

41. A device according to claim 34, wherein a plurality of said electron emission portions are formed on a single substrate.

42. A device according to claim 41, wherein said substrate comprises a semiconductor substrate.

43. A device according to claim 41, wherein said plurality of electron emission portions are electrically isolated from each other, and can independently emit electrons.

* * * * *